United States Patent [19]

Suzuki

[11] Patent Number: 5,487,875
[45] Date of Patent: Jan. 30, 1996

[54] MICROWAVE INTRODUCING DEVICE PROVIDED WITH AN ENDLESS CIRCULAR WAVEGUIDE AND PLASMA TREATING APPARATUS PROVIDED WITH SAID DEVICE

[75] Inventor: Nobumasa Suzuki, Yokohama, Japan

[73] Assignee: Canon Kabushiki Kaisha, Tokyo, Japan

[21] Appl. No.: 84,211

[22] PCT Filed: Nov. 5, 1992

[86] PCT No.: PCT/JP92/01430

§ 371 Date: Jul. 6, 1993

§ 102(e) Date: Jul. 6, 1993

[30] Foreign Application Priority Data

Nov. 5, 1991 [JP] Japan .................................. 3-315266
Nov. 8, 1991 [JP] Japan .................................. 3-293010

[51] Int. Cl.$^6$ .......................................................... H05H 1/46
[52] U.S. Cl. ................. 422/186.05; 422/186.04; 333/99 PL; 333/242; 315/111.21; 315/111.71; 219/691
[58] Field of Search .................. 422/186.04, 186.05; 333/99 PL, 242; 315/111.21, 111.71; 219/691

[56] References Cited

U.S. PATENT DOCUMENTS

| | | | |
|---|---|---|---|
| 3,585,540 | 6/1971 | Schuttloffel et al. | 333/95 |
| 4,536,767 | 8/1985 | Rembold et al. | 343/785 |
| 4,825,175 | 4/1989 | Tsuda et al. | 330/286 |
| 4,825,219 | 4/1989 | Ajioka | 343/771 |
| 5,003,687 | 4/1991 | Lapp et al. | 29/600 |
| 5,049,895 | 9/1991 | Ito et al. | 343/785 |
| 5,184,046 | 2/1993 | Campbell | 315/111.21 |
| 5,325,020 | 6/1994 | Campbell et al. | 315/111.21 |
| 5,389,154 | 2/1995 | Hiroshi et al. | 118/723 MR |
| 5,587,009 | 6/1971 | Kibler | 333/73 W |

Primary Examiner—Donald P. Walsh
Assistant Examiner—Daniel Jenkins
Attorney, Agent, or Firm—Fitzpatrick, Cella, Harper & Scinto

[57] ABSTRACT

A microwave introducing device has an endless circular waveguide provided with a plurality of slots. The circular waveguide is provided with a microwave introducing portion connected to a microwave power source, and the plurality of slots are spaced through an inner side of the circular waveguide such that the slots are arranged at the inner side of the circular waveguide at a given interval. A plasma treating apparatus can be provided with the microwave introducing device.

31 Claims, 22 Drawing Sheets

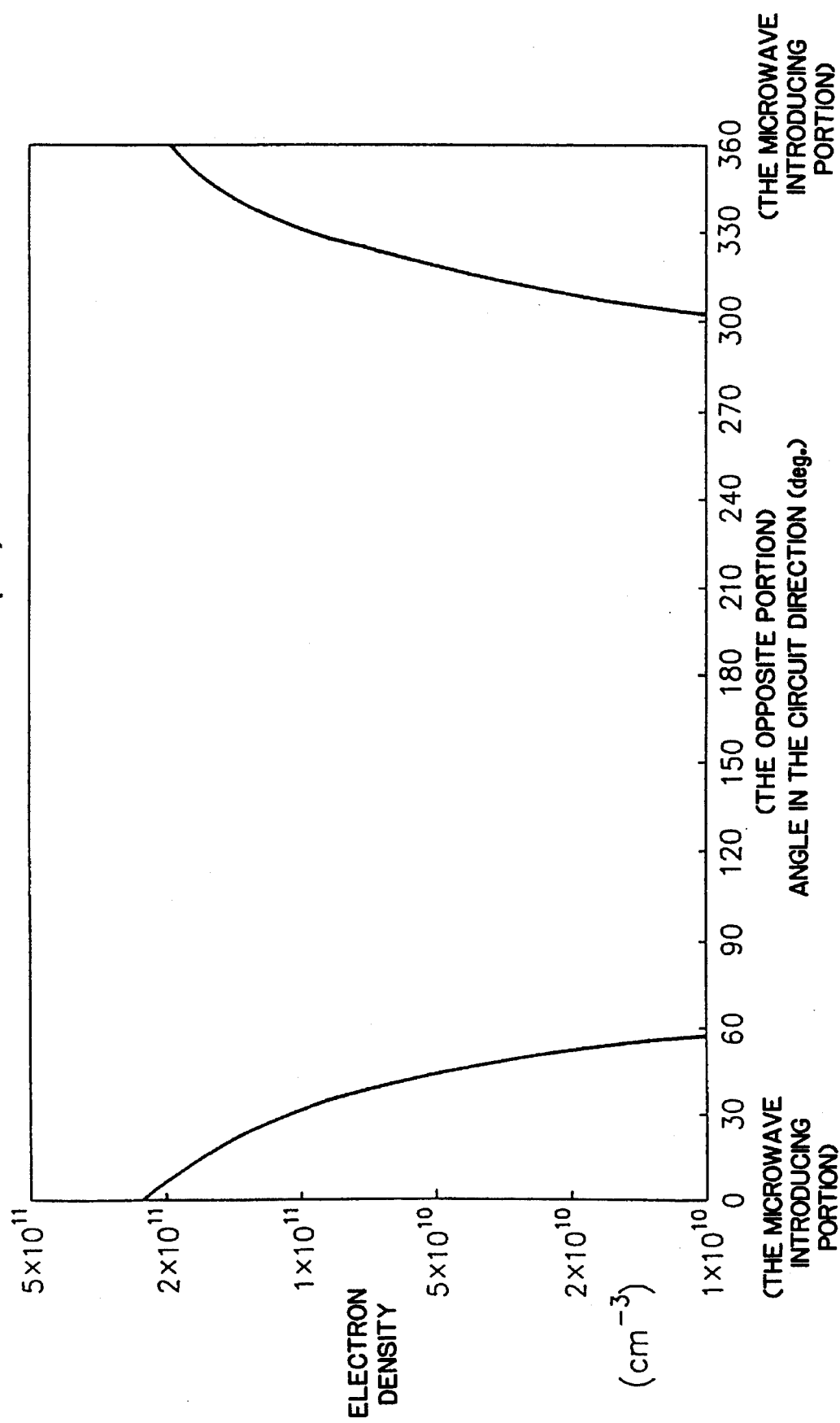

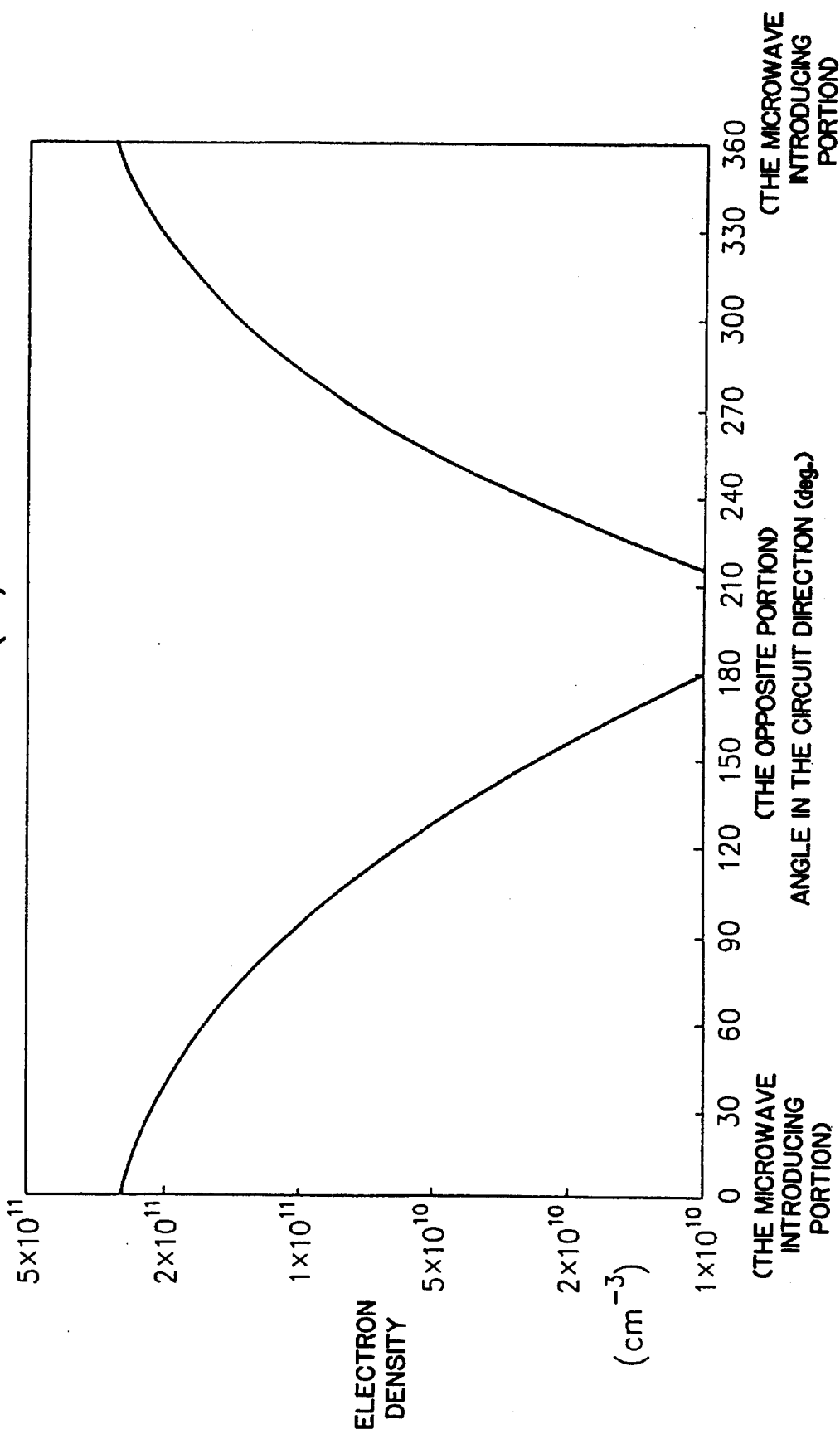

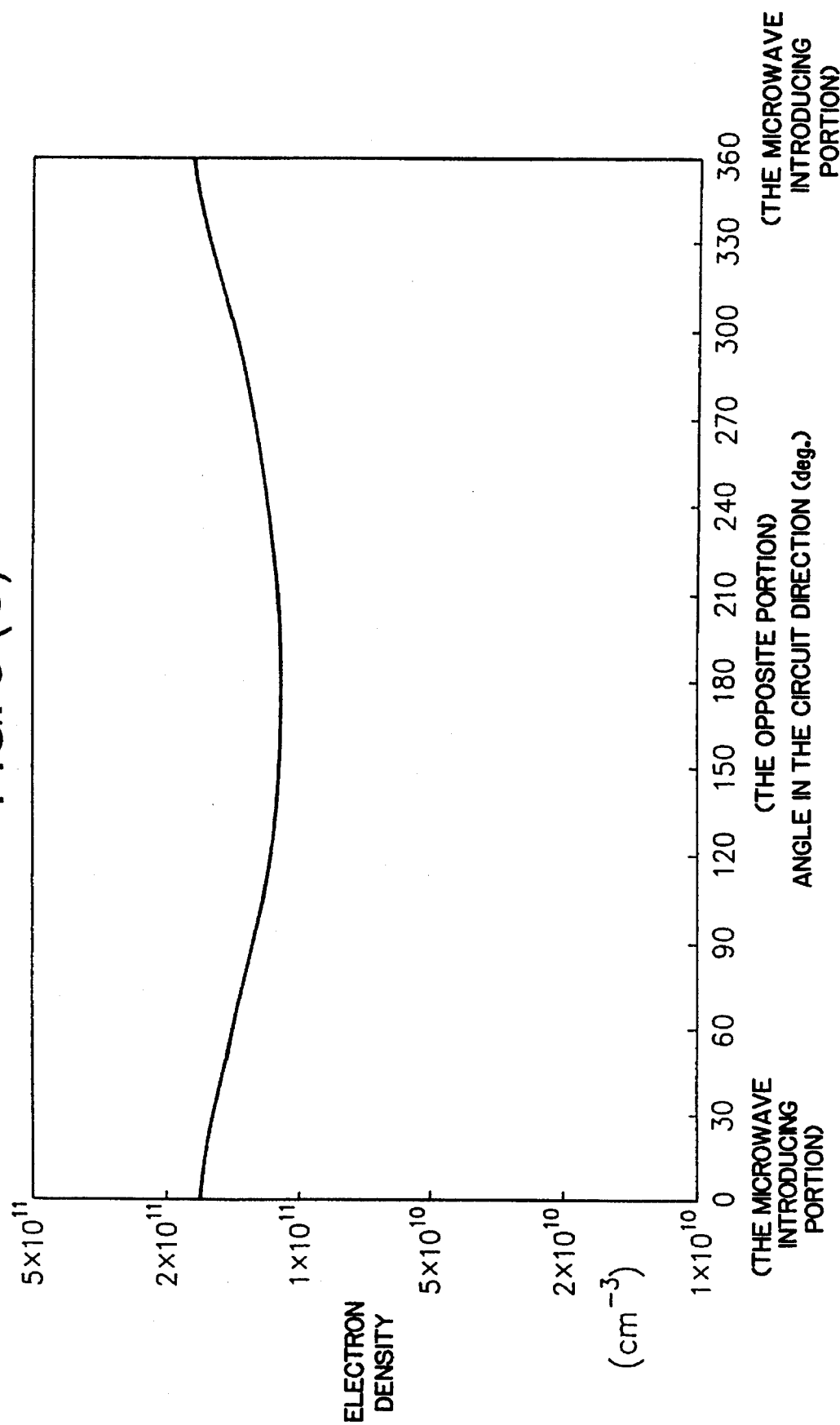

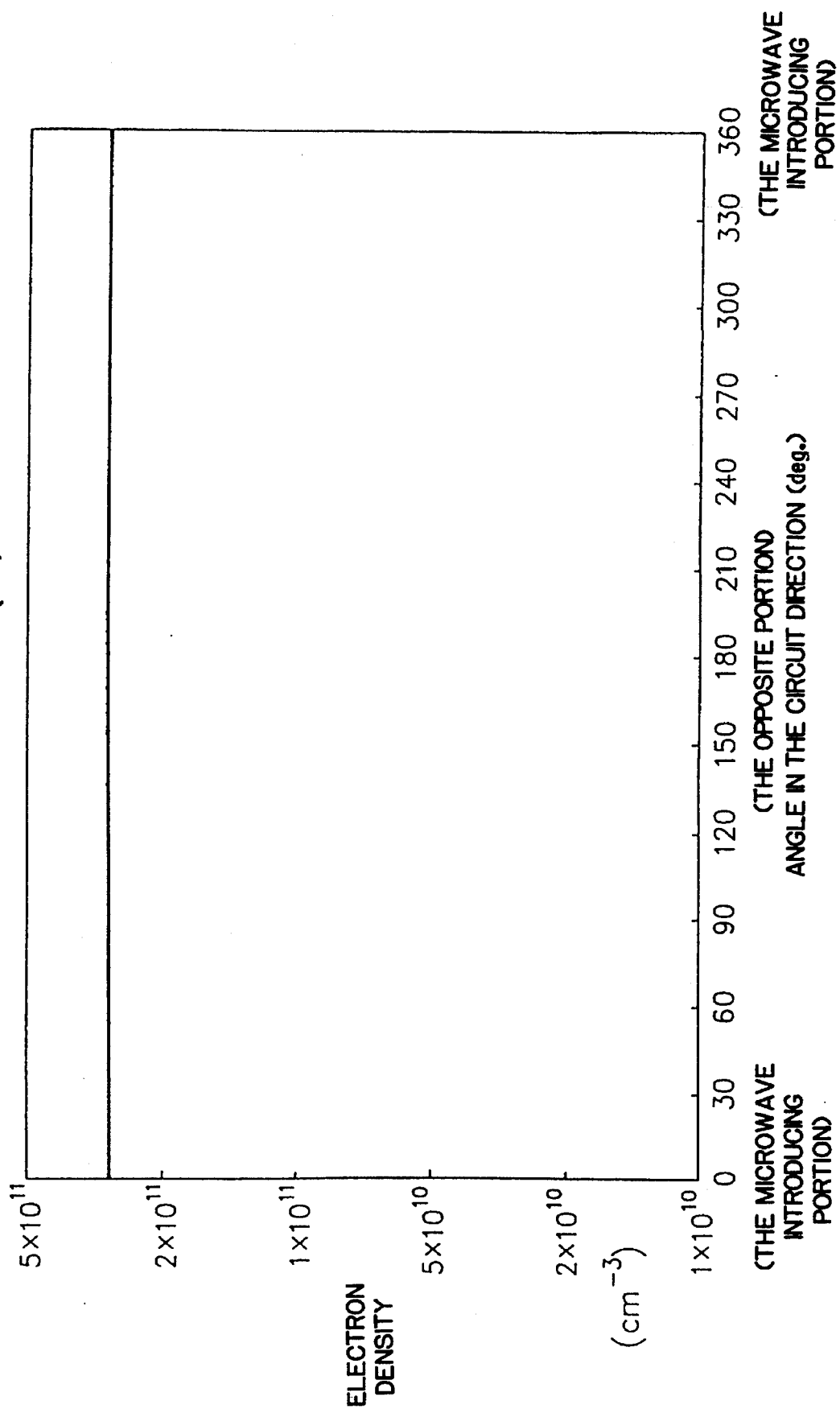

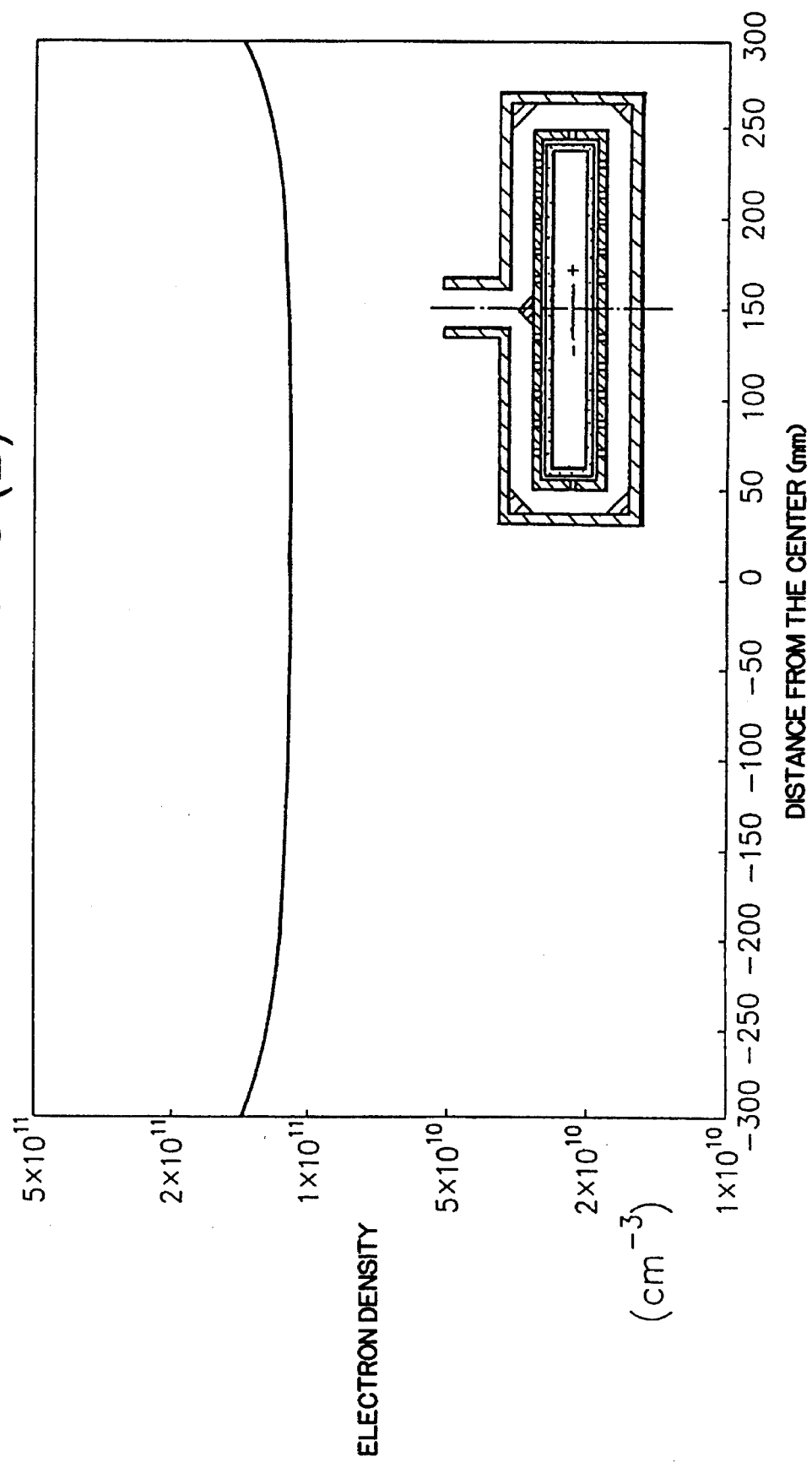

MICROWAVE INTRODUCING DEVICE PROVIDED WITH AN ENDLESS CIRCULAR WAVEGUIDE AND PLASMA TREATING APPARATUS PROVIDED WITH SAID DEVICE

FIELD OF THE INVENTION

The present invention relates to a microwave introducing device provided with an endless circular waveguide and to a plasma treating apparatus provided with said microwave introducing device. More particularly, the present invention relates to a microwave introducing device capable of uniformly and efficiently supplying a microwave from the entire circumferential wall of a vacuum vessel into which a microwave is to be introduced toward the center of said vacuum vessel and to a plasma treating apparatus provided with said microwave introducing device.

BACKGROUND OF THE INVENTION

There are known a number of plasma treating apparatus in which a microwave is used as the excitation source for generating plasma. Specific examples of such plasma apparatus are CVD apparatus, etching apparatus, and the like.

The formation of a deposited film using a so-called microwave plasma CVD apparatus is conducted, for example, in such a manner as will be described in the following. That is, a film-forming raw material gas is introduced into the film-forming chamber of the microwave plasma CVD apparatus, and at the same time, a microwave energy is introduced thereinto, whereby the film-forming raw material gas is excited and decomposed with the action of the microwave energy to produce plasma, resulting in causing the formation of a deposited film on a substrate placed in the film-forming chamber.

The etching treatment of a substrate to be treated using a so-called microwave plasma etching apparatus is conducted, for example, in such a manner as will be described in the following. That is, an etching raw material gas is introduced into the treating chamber of the microwave plasma etching apparatus, and at the same time, a microwave energy is introduced thereinto, whereby the etching raw material gas is excited and decomposed with the action of the microwave energy to produce plasma, resulting in etching the surface of said substrate with the plasma in the treating chamber.

In each of these microwave plasma treating apparatus, a microwave is used as the excitation source for the raw material gas used, and because of this, it is possible to chain-like accelerate and excite electrons generated as a result of ionizing the molecules of the raw material gas by an electric field with an extremely large frequency. In this respect, the microwave plasma treating apparatus has advantages such that a high excitation efficiency and a high decomposition efficiency can be attained as for the raw material gas, plasma with a high density can be relatively easily produced, and the plasma treatment of an object can be conducted at a high speed. In addition, there are further advantages in that the microwave plasma treating apparatus can be designed to be of a non-electrode discharging type because the microwave used has a property of transmitting through a dielectric material and in that case, the plasma treatment of an object can be conducted in a highly clean atmosphere.

The introduction of a microwave into these microwave plasma treating apparatus is usually conducted by one of the following three manners. That is, (i) a manner of introducing a microwave transmitted through a waveguide from a microwave power source into the plasma treating chamber through a coaxial antenna, (ii) a manner of introducing a microwave transmitted through a waveguide from a microwave power source into the plasma treating chamber through a dielectric window, and (iii) a manner of introducing a microwave transmitted through a waveguide from a microwave power source into the plasma treating chamber through one or more slots (that is, one or more apertures) disposed at said waveguide. There are known a number of plasma treating apparatus for subjecting an object to plasma treatment, in which these microwave introducing manners are employed.

As an example of the apparatus in which the above manner (i) is employed, there can be mentioned a plasma treating apparatus of the constitution in which a microwave is introduced into a plasma generation chamber through a coaxial antenna which is described, for example, in Japanese Laid-open patent application No. 131175/1980. The plasma treating apparatus described in this publication is of the constitution schematically shown in FIG. 10. The plasma treating apparatus shown in FIG. 10 comprises a vacuum vessel 2105 having an electrically insulative cylinder 2116 installed therein, said insulative cylinder 2116 having a plurality of specimens 2117 spacedly arranged on the inner wall face thereof. A microwave outputted by a microwave oscillation source 2101 is introduced into the vacuum vessel 2105 through a waveguide 2102 and an antenna 2121 made of a metal. When the microwave is introduced into the vacuum vessel 2105, plasma 2125 is produced between a cylindrical body 2122 made of a quartz and the insulative cylinder 2116, wherein the specimens 2117 are treated with the plasma generated. In FIG. 10, reference numeral 2106 indicates an exhaust pipe, reference numeral 2107 indicates a gas feed pipe, and reference numeral 2124 indicates cooling gas which is flown in the inside of the metallic antenna 2121. The above publication describes that according to the apparatus shown in FIG. 10, a plasma region of an area which is larger that the diameter of the waveguide 2102 can be formed in the space surrounding the antenna 2124, and the gas pressure of the plasma can be controlled to a large extent.

However, in the case of the plasma treating apparatus of the constitution shown in FIG. 10, the coaxial antenna is always positioned within the plasma generation chamber and because of this, a given inside area of the plasma generation chamber which is occupied by the coaxial antenna is not dedicated for the plasma treatment. Therefore, there is a limit for the capacity of the inside area of the plasma generation chamber which can be dedicated for the plasma treatment. Hence, this plasma treating apparatus hardly satisfies the requirement of establishing a high density plasma region of a large area as much as possible within a limited capacity so that the plasma can be efficiently utilized. In addition, the density of an electric power which can be applied to the coaxial antenna is governed by the size thereof and therefore, there is a restriction for the density of an electric power which can be applied to the coaxial antenna. In view of this, it is almost impossible for this plasma treating apparatus to attain high speed plasma treatment in which it is required to apply a microwave with a great electric power.

As an example of the apparatus in which the above manner (ii) is employed, there can be mentioned a plasma CVD apparatus of the constitution in which a microwave is introduced into a plasma generation chamber through a dielectric window which is described, for example, in Japanese Laid-open patent application No. 186849/1985.

The plasma CVD apparatus disclosed in said publication No. 186849/1985 is of the constitution shown in FIG. 11. The plasma CVD apparatus shown in FIG. 11 comprises a vacuum vessel as a deposition chamber 2222 in which a plurality of rotary shafts 2238 are spacedly arranged in parallel with each other, and a cylindrical drum member 2212 is positioned on each of said plurality of rotary shafts such that it can be rotated. The cylindrical drum members 2212 are rotated by a driving chain 2264 extending from a motor 2250. In FIG. 11, there are shown only two cylindrical drum members, but in practice, six cylindrical drum members 2212 are concentrically arranged while maintaining an equal interval between each adjacent cylindrical drum members to establish an inside chamber 2232 circumscribed by the six cylindrical drum members. The plasma CVD apparatus is hermetically provided with a microwave transmissive window 2296 which is situated above the inside chamber 2232. Reference numeral 2272 indicates a microwave power source. A microwave energy from the microwave power source is introduced into the inside chamber 2232 through an antenna probe 2276, waveguides 2280 and 2284, and the microwave transmissive window 2296. Similarly, the plasma CVD apparatus is hermetically provided with another microwave transmissive window 2294 which is situated below the inside chamber 2232. Reference numeral 2270 indicates another microwave power source. A microwave energy from this microwave power source is introduced into the inside chamber 2232 through an antenna probe 2274, waveguides 2278 and 2282, and the microwave transmissive window 2294.

The formation of a deposited film in this plasma CVD apparatus is conducted, for example, in the following manner. That is, the inside of the vacuum vessel 2222 is evacuated to a desired vacuum degree through an exhaust pipe 2224. Thereafter, raw material gases are introduced into the inside chamber 2232 through gas feed pipes 2226 and 2228. Microwave energy is then introduced into the inside chamber 2232 from the above and below sides, wherein the raw material gases introduced therein are decomposed to produce plasma 2268, whereby causing the formation of a semiconductor film for electrophotography on the surface of each of the cylindrical drum members 2212 each being maintained at a desired temperature by a heater 2200. The above publication describes that according to this plasma CVD apparatus, there can be formed a uniform deposited film on each of the cylindrical drum members 2212 at a high raw material gas utilization efficiency. However, in practice, there are disadvantages for the plasma CVD apparatus shown in FIG. 11 such that since the apparatus is of such constitution that microwave is introduced into the inside chamber 2232 from the above and below sides, the density of plasma generated in the vicinity of each of the microwave transmissive windows 2296 and 2294 unavoidably becomes higher than the density of plasma generated at the central part of the inside chamber 2232 and because of this, it is extremely difficult to form a uniform plasma region with a uniform density in the space of the inside chamber 2232, and as a result, the resulting deposited film on each of the cylindrical drum members 2212 varies in terms of film property between the film deposited on each of the opposite end portions of the cylindrical drum member 2212 and the film deposited on the central portion thereof. The plasma CVD apparatus shown in FIG. 11 also has a disadvantage such that since a microwave is introduced through each of the opposite microwave transmissive windows 2296 and 2294, it is necessary to appropriately adjust the microwave propagation mode and the position of each of the opposite waveguides such that the microwave introduced through one of the opposite microwave transmissive windows is prevented from transmitting through the other microwave transmissive window to get into the waveguide and the microwave power source.

As an example of the apparatus in which the above manner (iii) is employed, there can be mentioned a plasma treating apparatus of the constitution in which a microwave is introduced into a plasma generation chamber through slots (that is apertures) disposed at a waveguide which is described, for example, in Japanese Laid-open patent application No. 30420/1991. The plasma CVD apparatus described in this publication comprises a film-forming chamber (that is, a plasma generation chamber) having a circumferential wall formed by curving a web member as said web member is continuously moving in the longitudinal direction, in which a deposited film is formed on the inner wall face of the film-forming chamber. FIG. 12 is a schematic explanatory view illustrating the configuration of a circular waveguide 2301 which is used for introducing a microwave into the film-forming chamber of the plasma CVD apparatus. The circular waveguide 2301 has an end portion 2303 and a plurality of slots (that is, apertures) 2304 to 2308 being spacedly formed through one side thereof. A microwave transmitted from the direction expressed by an arrow is introduced into the film-forming chamber through the slots 2304 to 2308. The above publication describes that according to this plasma CVD apparatus, it is possible to continuously and uniformly form a large area of deposited film, and the thickness of the deposited film formed can be properly controlled by adjusting the transportation speed of the web member. However, there are disadvantages for this plasma CVD apparatus such that the density of plasma generated in the vicinity of the slots disposed at the waveguide 2301 in the film-forming chamber is remarkably higher than that of plasma generated in other regions in the film-forming chamber and because of this, it is extremely difficult to produce plasma in a uniform state in the film-forming chamber, and therefore, a well-skilled technique is required in order to form a homogenous and uniform deposited film on a large area web member. Incidentally, the circular waveguide 2301 is of the constitution in that the end portion 2303 is provided to terminate propagation of the microwave.

SUMMARY OF THE INVENTION

The principal object of the present invention is to eliminate the foregoing problems of the known microwave introducing devices and to provide an improved microwave introducing device capable of to uniformly and efficiently introducing a microwave into a vacuum vessel into which a microwave is to be introduced through the periphery thereof.

Another object of the present invention is to provide an improved microwave introducing device provided with a plurality of slots which enables to uniformly and efficiently introduce a microwave into a vacuum vessel through the periphery of said vacuum vessel.

A further object of the present invention is to provide an improved microwave introducing device provided with a plurality of slots capable of dividing a microwave transmitted into two directions and interfering the divided microwaves with each other which enables uniform and efficient introducing of a microwave into a vacuum vessel through the periphery of said vacuum vessel.

A further object of the present invention is to provide an improved plasma treating apparatus provided with the above-described microwave introducing device which can conduct uniform and efficient plasma treatment for an object to be treated.

A further object of the present invention is to provide an improved plasma treating apparatus provided with the above-described microwave introducing device which can localize a region for plasma to be generated and which enables to conduct uniform and efficient plasma treatment for an object to be treated, which is arranged to isolate from the said plasma generation region, without suffering from damages by the plasma.

A further object of the present invention is to provide an improved plasma treating apparatus provided with the above-described microwave introducing device further comprising means for generating a magnetic field, said magnetic field generating means being disposed respectively at a given position of said microwave introducing device in the vicinity of the slots and in parallel to the inner wall face of the plasma generation chamber, said improved plasma treating apparatus being capable of conducting uniform and efficient plasma treatment for an object to be treated.

A further object of the present invention is to provide an improved plasma treating apparatus provided with the above-described microwave introducing device which can efficiently form a desirable semiconductor film or a desirable insulative film excelling in uniformity.

A further object of the present invention is to provide an improved plasma treating apparatus provided with the above-described microwave introducing device which can localize a region for plasma to be generated and can uniformly and efficiently form a deposited film on a substrate, which is arranged to isolate from the said plasma generation region, without suffering from damages by the plasma.

A further object of the present invention is to provide an improved plasma treating apparatus provided with the above-described microwave introducing device which can uniformly and efficiently form a high quality deposited film on a web member or a lengthy substrate each having a relatively large width.

In order to eliminate the foregoing problems of the known microwave introducing devices and the known plasma treating apparatus provided with such microwave introducing devices and in order to attain the above objects, the present inventor made various studies through experiments which will be later described. As a result, the present inventor obtained a finding of the outline that in the case of using a microwave introducing device comprising an endless circular waveguide, which can be arranged to circumscribe vacuum vessel, and a means for introducing a microwave from a microwave power source into the circular waveguide wherein a plurality of slots each having a given shape are spaced at a given equal interval at the inner side of the circular waveguide, a microwave can be uniformly and efficiently introduced into a vacuum vessel through the periphery thereof. The present inventor obtained another finding that in the case of using a plasma treating apparatus in which said microwave introducing device is installed, an object to be treated which is positioned in a plasma generation space of the plasma treating apparatus can be uniformly and efficiently treated with plasma with plasma generated therein. The present inventor obtained a further finding that in the case of using a plasma treating apparatus in which the above microwave introducing device is installed, plasma can be produced in a localized state, and an object to be treated which is arranged to isolate from the region where the plasma is generated can be treated without suffering from damages by the plasma. The present inventor obtained a further finding that in the case of using a plasma treating apparatus in which the above microwave introducing device is installed, a high quality deposited film can be uniformly and efficiently formed on a substrate. The present inventor obtained a further finding that in the case of using a plasma treating apparatus in which the above microwave introducing device is installed, plasma can be produced in a localized state, and a high quality deposited film can be uniformly and efficiently formed on a substrate on which a film is to be deposited, which is arranged to isolate from the region where the plasma is generated, without suffering from damages by the plasma. The present inventor obtained a further finding that in the case of using a plasma treating apparatus in which the above microwave introducing device is installed, a high quality deposited film can be uniformly and efficiently formed on a web member or a lengthy substrate each having a relatively large width.

The present invention has been accomplished based on the above findings obtained by the present inventor through the experiments.

Figure 1:
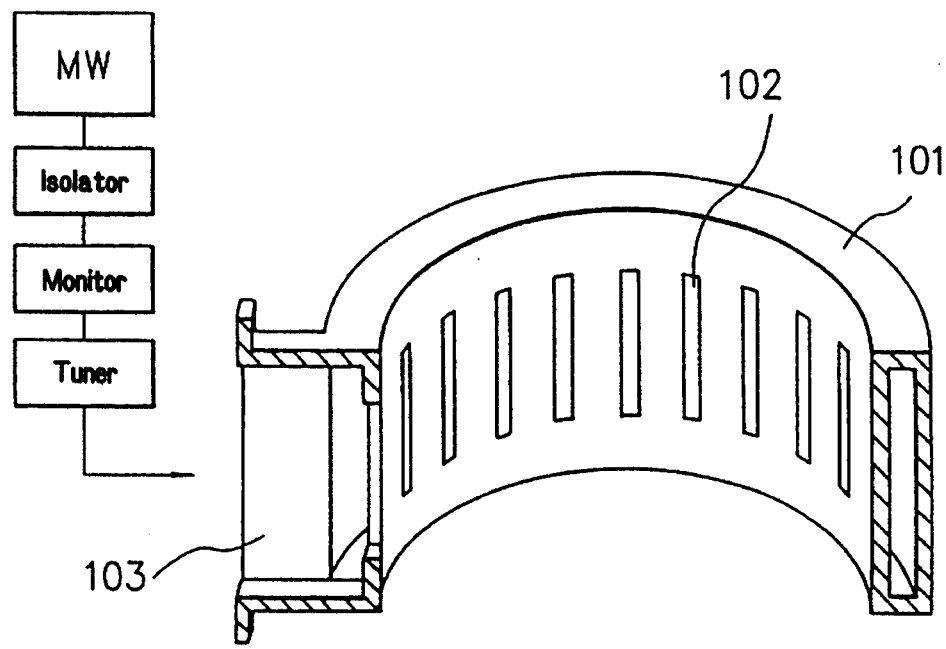
FIG. 1(A) is a schematic view illustrating an example of a microwave introducing device according to the present invention.
FIG. 1(B) is a schematic explanatory view of an apparatus employed in the experiments conducted upon accomplishing the present invention.
Figure 1:
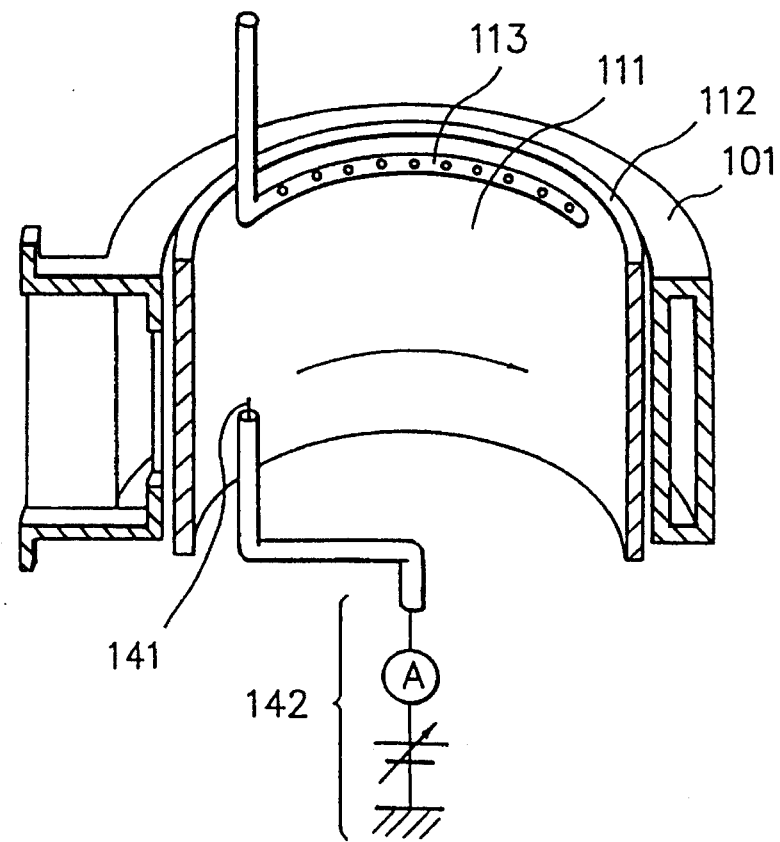

Description will be made of embodiments of a microwave introducing device according to the present invention which is of any of the following configuration and of embodiments of a plasma treating apparatus provided with such microwave introducing device according to the present invention.

1. Microwave Introducing Device

The microwave introducing device according to the present invention includes Embodiment 1-(1) to Embodiment 1-(5) which will be described below.

Embodiment 1-(1)

A microwave introducing device comprising a waveguide and means for introducing a microwave from a microwave power source into said waveguide, characterized in that said waveguide is an endless circular waveguide, and a plurality of slots each having a given shape are spaced at the inner side face of said circular waveguide at a given equal interval.

Embodiment 1-(2)

A microwave introducing device comprising a waveguide and means for introducing a microwave from a microwave power source into said waveguide, characterized in that said waveguide is an endless circular waveguide, and a plurality of slots each having a given shape are spaced at the inner side face of said circular waveguide at an equal interval corresponding to a 1/4 of the guide wavelength of said microwave.

Embodiment 1-(3)

A microwave introducing device comprising a waveguide and means for introducing a microwave from a microwave power source into said waveguide, characterized in that said waveguide is an endless circular waveguide, a plurality of slots each having a given shape are spaced at the inner side face of said circular waveguide at a given equal interval, and said microwave introducing means is disposed to direct to the tangential direction of said circular waveguide.

Embodiment 1-(4)

A microwave introducing device comprising a waveguide and means for introducing a microwave from a microwave power source into said waveguide, characterized in that said waveguide is an endless circular waveguide, a plurality of slots each having a given shape are spaced at the inner side face of said circular waveguide at an equal interval, and said plurality of slots are designed such that their length in the direction perpendicular to the direction of the microwave to transmit is gradually increased along the direction of the microwave to transmit.

Embodiment 1-(5)

A microwave introducing device comprising a waveguide and means for introducing a microwave from a microwave power source into said waveguide, characterized in that said waveguide is an endless circular waveguide, a plurality of slots each having a given shape are spaced at the inner side face of said circular waveguide at a given equal interval, and said microwave introducing means is provided with means capable of dividing said microwave into two directions so that the microwave transmits in opposite directions in the circular waveguide.

2. Plasma Treating Apparatus

The plasma treating apparatus according to the present invention includes Embodiment 2-(1) to Embodiment 2-(8) each being provided with one of the microwave introducing devices described in the above Embodiments 1-(1) to 1-(5) which will be described below.

Embodiment 2-(1)

A plasma treating apparatus comprising a plasma generation chamber capable of being vacuumed and a microwave introducing means, said microwave introducing means being arranged along the periphery of said plasma generation chamber so as to circumscribe said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma in said plasma generation chamber whereby an object to be treated which is positioned in said plasma generation chamber is treated with the plasma.

Embodiment 2-(2)

A plasma treating apparatus comprising a plasma generation chamber capable of being vacuumed, a microwave introducing means which is arranged along the periphery of said plasma generation chamber so as to circumscribe said plasma generation chamber, and a treating chamber which is isolated from but is communicated with said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma containing active species in said plasma generation chamber, said active species are introduced into said treating chamber wherein an object to be treated which is positioned therein is treated with the active species.

Embodiment 2-(3)

A plasma treating apparatus comprising a plasma generation chamber capable of being vacuumed and a microwave introducing means which is arranged along the periphery of said plasma generation chamber so as to circumscribe said plasma generation chamber, said microwave introducing means comprising one of the microwave introducing devices described in the foregoing Embodiments 1-(1) to 1-(5), said plasma generation chamber being provided with a plurality of magnetic field generating means each being disposed at a given position thereof in the vicinity of the slots and in parallel to the inner wall face of the plasma generation chamber, wherein a microwave is uniformly introduced into said plasma generation chamber through the circumferential wall thereof to generate plasma in said plasma generation chamber whereby an object to be treated which is positioned in said plasma generation chamber is treated with the plasma.

Embodiment 2-(4)

A plasma treating apparatus comprising a plasma generation chamber capable of being vacuumed, a microwave introducing means which is arranged along the periphery of said plasma generation chamber so as to circumscribe said plasma generation chamber, and a treating chamber which is isolated from but is communicated with said plasma generation chamber, said microwave introducing means comprising one of the microwave introducing devices described in the foregoing Embodiments 1-(1) to 1-(5), said plasma generation chamber being provided with a plurality of magnetic field generating means each being disposed at a given position thereof in the vicinity of the slots and in parallel to the inner wall face of the plasma generation chamber, wherein a microwave is uniformly introduced into said plasma generation chamber through the circumferential wall thereof to generate plasma containing active species in said plasma generation chamber, said active species are introduced into said treating chamber wherein an object to be treated which is positioned therein is treated with the active species.

Embodiment 2-(5)

A plasma treating apparatus comprising a plasma generation chamber capable of being vacuumed and a microwave introducing means, said microwave introducing means being arranged along the periphery of said plasma generation chamber so as to circumscribe said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma in said plasma generation chamber whereby a cylindrical substrate as the object to be treated is treated with the plasma without moving said cylindrical substrate or while moving said cylindrical substrate in parallel to the central axis thereof.

Embodiment 2-(6)

A plasma treating apparatus comprising a plasma generation chamber capable of being vacuumed and a microwave introducing means, said microwave introducing means being arranged along the periphery of said plasma generation chamber so as to circumscribe said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma in said plasma generation chamber whereby a plurality of cylindrical substrates as the object to be treated are treated with the plasma without moving said cylindrical substrates or while moving said cylindrical substrates in parallel to their central axis.

Embodiment 2-(7)

A plasma treating apparatus comprising a plasma generation chamber capable of being vacuumed and a microwave introducing means, said microwave introducing means being arranged along the periphery of said plasma generation chamber so as to circumscribe said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma in said plasma generation chamber whereby a web member or a lengthy substrate as the object to be treated is treated with the plasma while continuously moving said web member or lengthy substrate in the longitudinal direction.

Embodiment 2-(8)

A plasma treating apparatus comprising a plasma generation chamber having a rectangular cross section and capable of being vacuumed and a rectangular microwave introducing means, said microwave introducing means being arranged along the periphery of said plasma generation chamber so as to circumscribe said plasma generation chamber, said microwave introducing means comprising one of the microwave introducing devices described in the foregoing Embodiments 1-(1) to 1-(5), wherein a microwave is uniformly introduced into said plasma generation chamber through the circumferential wall thereof to generate plasma in said plasma generation chamber whereby two web members or two lengthy substrates as the object to be treated are treated with the plasma while continuously moving said web members or lengthy substrates in the longitudinal direction while facing their faces to be treated toward the respective sides of the microwave introducing device.

Each of the microwave introducing devices described in the foregoing Embodiments 1-(1) to 1-(5) of the present invention is free of the foregoing problems of the known microwave introducing devices and provides significant advantages which will be described below.

That is, in the case of the microwave introducing device described in the foregoing Embodiment 1-(1), there are advantages such that a microwave in a state of an electromagnetic wave can be introduced into the vacuum vessel through the periphery thereof, wherein the uniform and efficient introduction of a microwave into the vacuum vessel can be effectively attained.

In the case of the microwave introducing device described in the foregoing Embodiment 1-(2), there are advantages such that a microwave in a state of an electromagnetic wave can be uniformly introduced into the vacuum vessel through each of the slots, wherein the uniform and efficient introduction of a microwave into the vacuum vessel can be effectively attained.

In the case of the microwave introducing device described in the foregoing Embodiment 1-(3), there are advantages such that reflection of a microwave toward the microwave power source in the waveguide is effectively prevented in a desirable state, and a microwave can be uniformly and extremely effectively introduced into the vacuum vessel.

In the case of the microwave introducing device described in the foregoing Embodiment 1-(4), there are advantages such that the quantity of a microwave to be introduced through each of the slots can be properly controlled, and a microwave can be uniformly and extremely effectively introduced into the vacuum vessel.

In the case of the microwave introducing device described in the foregoing Embodiment 1-(5), there are advantages such that the slots can be made to conform to a so-called belly caused due to interference of microwave and a microwave can be uniformly and extremely effectively introduced into the vacuum vessel.

Each of the plasma treating apparatus described in the foregoing Embodiments 2-(1) to 2-(8) of the present invention is free of the foregoing problems of the known plasma treating apparatus and provides significant advantages which will be described below.

That is, in the case of the plasma treating apparatus described in the foregoing Embodiment 2-(1), there are advantages such that a microwave can be uniformly and efficiently introduced into the plasma generation chamber through the entire circumferential wall of the plasma generation chamber, and because of this, plasma can be produced in a uniform state and at a high density, wherein uniform and efficient plasma treatment for an object or uniform and efficient formation of a deposited film on a substrate can be conducted.

In the case of the plasma treating apparatus described in the foregoing Embodiment 2-(2), there are advantages such that a microwave with a high frequency can be uniformly and efficiently introduced into the plasma generation chamber through the entire circumferential wall of the plasma generation chamber, and because of this, a uniform plasma with a high density can formed in a localized state in the plasma generation chamber, wherein uniform and efficient treatment for a substrate positioned to isolate from the plasma generation region or uniform and efficient formation of a deposited film on said substrate can be conducted without suffering from damages by the plasma.

In the case of the plasma treating apparatus described in the foregoing Embodiment 2-(3), there are advantages such that electrons of the plasma generated can be localized at an extremely high density and because of this, uniform and efficient treatment for a substrate or uniform and efficient formation of a deposited film on said substrate can be conducted.

In the case of the plasma treating apparatus described in the foregoing Embodiment 2-(4), there are advantages such that electrons of the plasma generated can be localized at an extremely high density and because of this, uniform and efficient treatment for a substrate positioned to isolate from the plasma generation region or uniform and efficient formation of a deposited film on said substrate can be conducted without suffering from damages by the plasma.

In the case of the plasma treating apparatus described in the foregoing Embodiment 2-(5), there are advantages such that a microwave can be uniformly and efficiently introduced into the plasma generation chamber through the entire circumferential wall of the plasma generation chamber and because of this, plasma can be produced in a uniform state and at a high density, wherein uniform and efficient treatment for a cylindrical substrate or uniform and efficient formation of a deposited film on said cylindrical substrate can be conducted.

In the case of the plasma treating apparatus described in the foregoing Embodiment 2-(6), there are advantages such that a microwave can be uniformly and efficiently introduced into the plasma generation chamber through the entire circumferential wall of the plasma generation chamber and because of this, plasma can be produced in a uniform state and at a high density, wherein uniform and efficient treatment for a plurality of cylindrical substrates or uniform and efficient formation of a deposited film on each of said cylindrical substrates can be conducted.

In the case of the plasma treating apparatus described in the foregoing Embodiment 2-(7), there are advantages such that a microwave can be uniformly and efficiently introduced into the plasma generation chamber through the entire circumferential wall of the plasma generation chamber and because of this, plasma can be produced in a uniform state and at a high density, wherein uniform and efficient treatment for a relatively wide web member or lengthy substrate or uniform and efficient formation of a deposited film on such relatively wide web member or lengthy substrate can be continuously conducted.

In the case of the plasma treating apparatus described in the foregoing Embodiment 2-(8), there are advantages such that a microwave can be uniformly and efficiently introduced into the plasma generation chamber through the entire circumferential wall of the plasma generation chamber and because of this, plasma can be produced in a uniform state and at a high density, wherein uniform and efficient treatment for two relatively wide web members or lengthy substrates or uniform and efficient formation of a deposited film on each of said two relatively wide web members or lengthy substrates can be continuously conducted.

In the following, description will be made of the experiments conducted by the present inventor.

Experiment 1

This experiment was conducted for the purpose of examining whether or not a cylindrical microwave introducing device is superior to a linear microwave introducing device in terms of plasma density distribution in the plasma generation chamber. In this experiment, there were provided a conventional linear microwave introducing device and a cylindrical microwave introducing device. Each of these microwave introducing devices was evaluated in a manner that the microwave introducing device is disposed at the exterior of a cylindrical plasma generation chamber made of a quartz, a microwave is introduced into the plasma generation chamber through the microwave introducing device to generate plasma, and the density distribution of the plasma generated in the circuit direction is measured by means of a conventional probe method.

Figure 2:
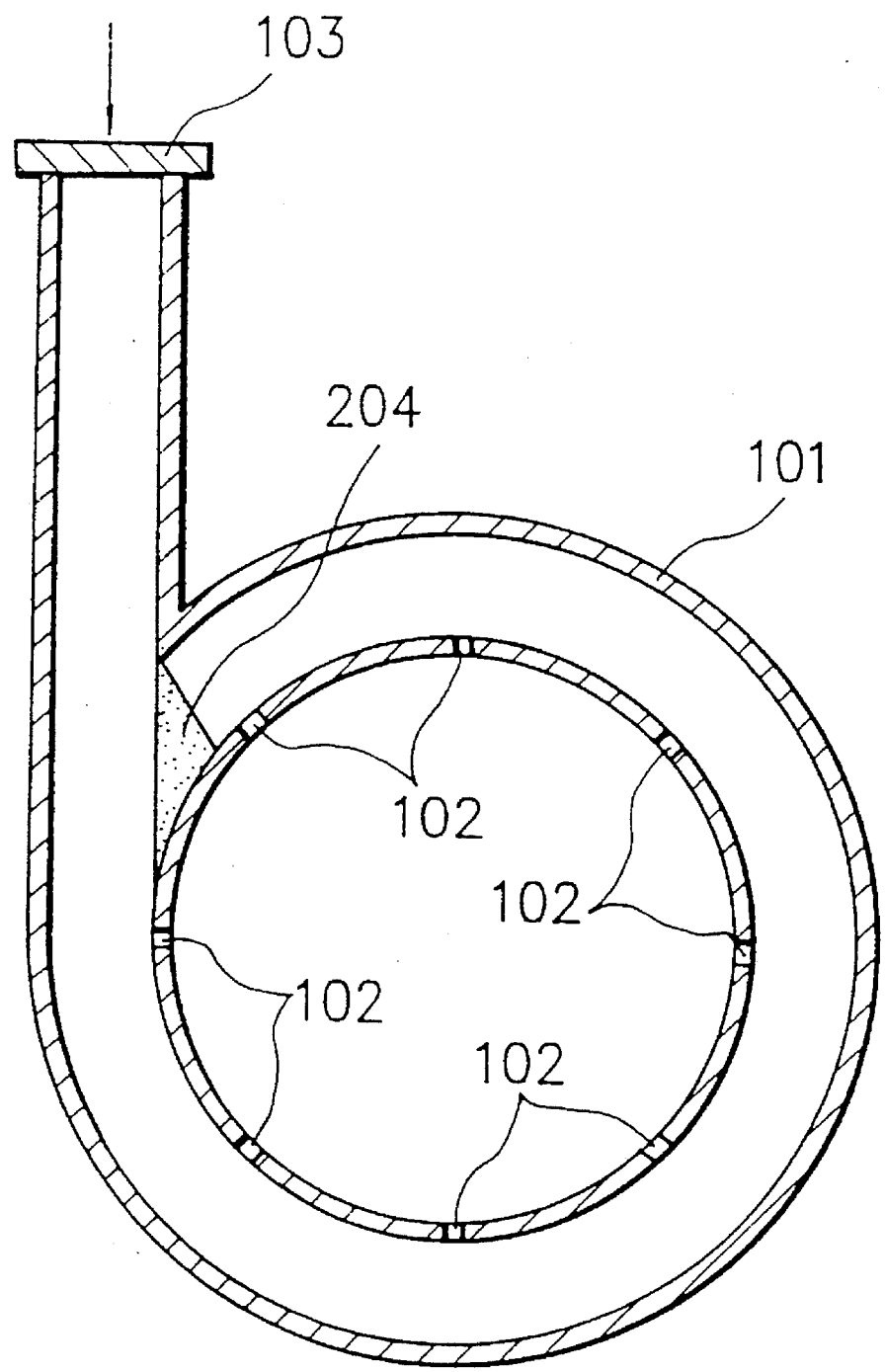
FIG. 2(A) is a schematic view illustrating the configuration of an example of a microwave introducing device according to the present invention.
FIG. 2(B) is a graph showing the results obtained in Experiment 1 which was conducted upon accomplishing the present invention.
FIG. 2(C) is a graph showing the results obtained in the comparative test in Experiment 1, which was conducted upon accomplishing the present invention.
Figure 2:
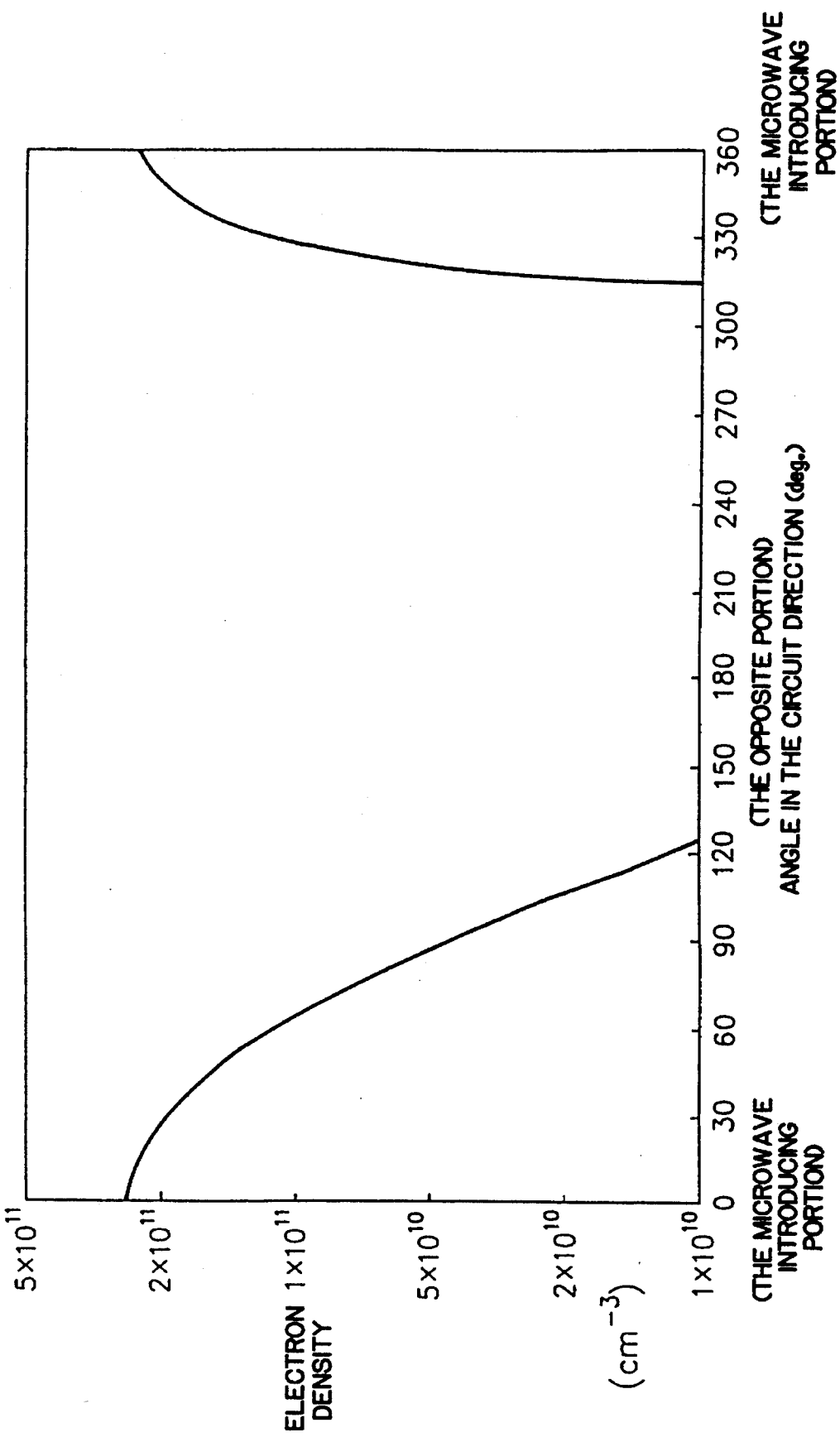

As the cylindrical microwave introducing device, there was used a cylindrical microwave introducing device of the configuration shown in FIG. 2(A), wherein reference numeral 101 indicates a cylindrical waveguide, reference numeral 102 indicates a plurality of slots spacedly formed at the inner side of the cylindrical waveguide 101 which serve to introduce a microwave from the cylindrical waveguide 101 into a plasma generation chamber (not shown), reference numeral 103 indicates a microwave introducing portion which serves to transmit a microwave therethrough into the cylindrical waveguide 101, and reference numeral 204 indicates a reflection terminal block which serves to reflect the microwave. The cylindrical waveguide 101 is dimensioned to have an inside wall cross section size of 27 mm×96 mm, which is the same as that of the waveguide under the WRT-2 standard, and a central diameter of 354 mm. The cylindrical waveguide 101 is constituted by stainless steel so as to have desirable mechanical strength, and the inside wall face thereof is applied with a coating comprising a copper layer and a silver layer by means of a conventional metal plating technique for the purpose of preventing occurrence of transmission loss of a microwave. Each of the slots of the cylindrical waveguide is shaped in a rectangular form of 60 mm in length and 4 mm in width. The slots are spaced at an equal interval corresponding to a ¼ of the guide wavelength of microwave. The guide wavelength of microwave is different depending upon the frequency of a microwave used and the cross section size of the waveguide. In the case where a microwave with a frequency of 2.45 GHz is used and as the waveguide, the above-mentioned cylindrical waveguide is used, it is about 159 mm. Specifically, the cylindrical waveguide 101 used in this experiment is provided with 28 slots being spaced at an equal interval of about 40 mm.

The microwave introducing portion 103 is connected to a microwave power source with a frequency of 2.45 GHz through a four-stub tuner, a directivity coupling device and an isolator (this part is not shown in the figure).

Figure 12:
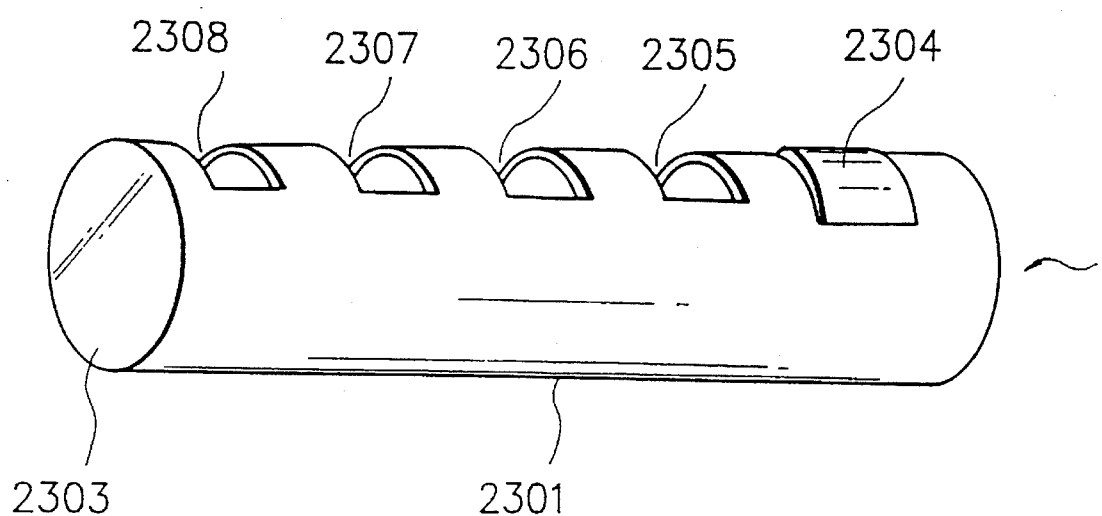
FIG. 12 is a schematic view for explaining the known slot type microwave introducing device.

The generation of plasma and the measurement of the density distribution of the plasma generated were conducted in the case of the microwave introducing device shown in FIG. 2(A) installed in a plasma treating apparatus shown in FIG. 1(B) and also in the case of the conventional microwave introducing device shown in FIG. 12 installed in said plasma treating apparatus.

The plasma treating apparatus shown in FIG. 1(B) comprises a cylindrical quartz tube 112 as a plasma generation chamber having a plasma generation space 111, a gas feed pipe 113 which serves to supply a plasma generating raw material gas into the plasma generation space 111, a probe 141 made of a platinum which serves to measure the density of plasma generated, and a I–V characteristic-measuring device 142 which serves to measure an electric current flown when a given voltage is applied to the probe 141.

The outer diameter of the cylindrical quartz tube 112 is 320 mm. The probe 141 is designed such that it can be rotated 360° in the circuit direction.

The generation of plasma was conducted in the following manner. That is, the plasma generation space 111 was evacuated to a vacuum degree of $10^{-6}$ Torr through an exhaust system (not shown). Nitrogen gas was then introduced through the gas feed pipe 113 into the plasma generation space 111 at a flow rate of 1 slm. Thereafter, the gas pressure of the plasma generation space 111 was adjusted to and maintained at 50 mTorr by regulating a conductance valve (not shown) disposed at the exhaust system. A microwave power source of 2.45 GHz (not shown) was switched on to apply a microwave power of 500 W into the plasma generation space 111 through the cylindrical waveguide 101, wherein plasma was generated in the plasma generation space 111. The reflected power in this case was 45 W.

The measurement of the density distribution of the plasma generated was conducted by means of a conventional single probe method in the following manner. That is, a different voltage in the range of −50 V to +50 V was applied to the probe 141, an electric current flown in the probe 141 was measured by the I–V characteristic-measuring device 142 in each case, an I–V curve was obtained based on the measured results, and on the basis of the I–V curve, an electron density was obtained in accordance with the Langmuir's method. This procedure was repeated except for changing the position of the probe 141 in the circuit direction in the plasma generation space 111, whereby obtaining the electron density of the plasma in each case. On the basis of the measured results, the density distribution of the plasma in the circuit direction was evaluated.

In this way, there were obtained the density distributions of plasma in the circuit direction in the case of using the microwave introducing device shown in FIG. 2(A) and the density distributions of plasma in the circuit direction in the case of using the conventional microwave introducing device shown in FIG. 12. These results obtained are graphically shown respectively in FIG. 2(B) and FIG. 2(C). From the results shown in FIGS. 2(B) and 2(C), the following facts are understood. That is, the discharge region in the case of using the cylindrical microwave introducing device is greater than that in the case of using the linear microwave introducing device, but in the former, there is still found a tendency of causing a certain offset of plasma not only in the vicinity of the microwave introducing member but also in the vicinity of the reflection terminal block.

However, from the results obtained in this experiment, it has been found that the configuration in which the conventional linear waveguide provided with a plurality of slots is arranged so as to circumscribe the plasma generation chamber is not sufficient enough for uniformly introducing a microwave into the plasma generation chamber.

Experiment 2

This experiment was conducted to find out whether or not a desirable effect is provided with regard to the density distribution of plasma in the plasma generation space when a cylindrical microwave introducing device with no reflection terminal block is used.

In this experiment, there was used a cylindrical microwave introducing device with no reflection terminal block of the same configuration as that of the cylindrical microwave introducing device used in the above experiment except for having no reflection terminal block and in which the microwave introduction portion is directed toward the tangential direction for the inner side wall thereof situated beside the exterior of a cylindrical plasma generation chamber made of a quartz around which the cylindrical microwave introducing device is arranged. Plasma was generated in the plasma generation chamber by introducing a microwave thereinto through this cylindrical microwave introducing device, wherein the spatial density distribution of the plasma in the circuit direction was examined by means of a conventional probe method. The results obtained were compared with the results obtained in Experiment 1 in which the cylindrical microwave introducing device having the reflection terminal block was used.

Figure 3:
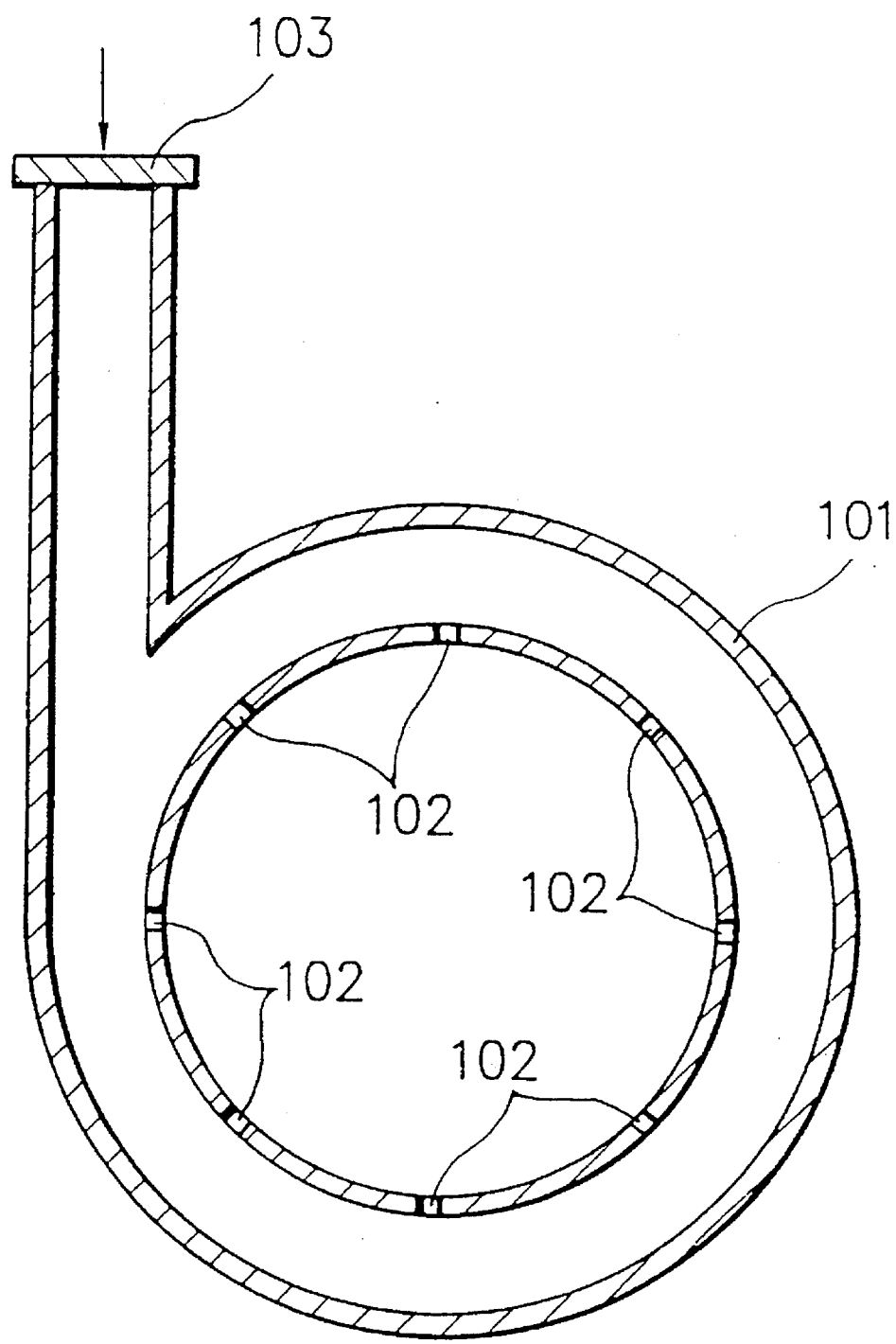
FIG. 3(A) is a schematic view illustrating the configuration of another example of a microwave introducing device according to the present invention.
FIG. 3(B) is a graph showing the results obtained in Experiment 2 which was conducted upon accomplishing the present invention.
FIG. 3(C) is a graph showing the results obtained in Experiment 3 which was conducted upon accomplishing the present invention.

The cylindrical microwave introducing device used in this experiment is of the configuration shown in FIG. 3(A). In the figure, reference numeral 101 indicates a cylindrical waveguide, reference numeral 102 indicates a plurality of slots spacedly formed at the inner side of the cylindrical waveguide 101 which serve to introduce a microwave from the cylindrical waveguide 101 into a plasma Generation chamber (not shown), and reference numeral 103 indicates a microwave introducing portion which serves to transmit a microwave therethrough into the cylindrical waveguide 101.

The cylindrical microwave introducing device shown in FIG. 3(A) used in this experiment comprises a partial modification of the cylindrical microwave introducing device shown in FIG. 2(A) used in Experiment i in which the reflection terminal block 204 is omitted, and except this, the configuration of the former is the same as that described in Experiment 1.

The Generation of plasma and the measurement of the density distribution of the plasma Generated were conducted respectively in the same manner as in Experiment 1, wherein the cylindrical microwave introducing device shown in FIG. 3(A) was installed in the plasma treating apparatus shown in FIG. 1(B). The reflected power upon the plasma generation was substantially zero watt. From this, it is understood that the impedance matching in this case is superior to that in Experiment 1.

The results obtained with regard to density distribution of the plasma in the circuit direction are graphically shown in FIG. 3(B). From the results shown in FIG. 3(B), the following facts are understood. That is, the discharge region in the case of this experiment is greater than that in the case of Experiment 1 wherein the cylindrical microwave introducing device having the reflection terminal block, but in the former, there is still found a region wherein no plasma is observed at the position opposite the microwave introducing portion 103 and which is remote from said microwave introducing portion. However, from the results obtained in this experiment, there was found that the use of the foregoing cylindrical waveguide with no reflection terminal block makes it possible to efficiently introduce a microwave through the cylindrical waveguide into the plasma generation chamber while reducing occurrence of microwave reflection, wherein the microwave introduced efficiently transmits in the cylindrical waveguide without being reflected.

Experiment 3

This experiment was conducted to find out whether or not a desirable effect is provided with regard to the density distribution of plasma in the plasma generation space when the slots of the cylindrical microwave introducing device are dimensioned such that their length is gradually increased along the direction of a microwave to transmit.

In this experiment, there were used a plurality of cylindrical microwave introducing devices in which their slots to be situated beside the quartz cylindrical plasma generation chamber are varied with respect to length distribution. Using each of these cylindrical microwave introducing devices, a microwave was introduced into the cylindrical plasma generation chamber through the periphery thereof to generate plasma therein, wherein the spatial density distribution of the plasma in the circuit direction was examined by means of a conventional probe method. The results obtained were compared with the results obtained in Experiment 2 in which the cylindrical microwave introducing device provided with a plurality of slots having a constant length was used.

The configuration of each of the cylindrical microwave introducing devices used in this experiment is the same as that of the cylindrical microwave introducing device shown in FIG. 3(A) used in Experiment 2. In FIG. 3(A), reference numeral 101 indicates a cylindrical waveguide, reference numeral 102 indicates a plurality of slots spacedly formed at the inner side of the cylindrical waveguide 101 which serve to introduce a microwave from the cylindrical waveguide 101 into a plasma generation chamber (not shown), and reference numeral 103 indicates a microwave introducing member which serves to transmit a microwave therethrough into the cylindrical waveguide 101.

Each of the cylindrical microwave introducing devices used in this experiment comprises a partial modification of the cylindrical microwave introducing device shown in FIG. 3(A) used in Experiment 2 in which the slots are dimensioned such that their length is gradually increased in the range of from 40 mm to 75 mm along the direction of a microwave to transmit in each case, and except this, the configuration of the former is the same as that described in Experiment 2.

The generation of plasma and the measurement of the density distribution of the plasma generated were conducted respectively in the same manner as in Experiment 1, wherein each of the above cylindrical microwave introducing devices having the configuration shown in FIG. 3(A) was installed in the plasma treating apparatus shown in FIG. 1(B).

The results obtained with regard to density distribution of the plasma in the circuit direction are graphically shown in FIG. 3(C). From the results shown in FIG. 3(C), the following facts are understood. That is, the discharge region is greater than that in the case of using the cylindrical microwave introducing device used in Experiment 2 and discharge is caused in the entire circuit, but the plasma density distribution is still varied at a value of ±12% which is not satisfactory. However, from the results obtained in this experiment, there were found facts that the use of the cylindrical microwave introducing device in which the slots are dimensioned such that their length is gradually increased along the direction of a microwave to transmit provides an improvement in microwave leakage at each of the slots and another improvement in the uniformity of the density distribution of plasma.

Experiment 4

This experiment was conducted to find out whether or not a desirable effect is provided with regard to the density distribution of plasma in the plasma generation space when a two-way delivery interfering type cylindrical microwave introducing device is used.

In this experiment, using a cylindrical microwave introducing device having a cylindrical waveguide provided with a microwave introducing portion disposed perpendicularly thereto which is capable of delivering a microwave in two ways so as to cause an interference among the microwaves delivered, a microwave was introduced into the cylindrical plasma generation chamber through the periphery thereof to generate plasma therein, wherein the spatial density distribution of the plasma in the circuit direction was examined by means of a conventional probe method. The results obtained were compared with the results obtained in Experiment 3 in which the tangential type cylindrical microwave introducing device was used.

Figure 4:
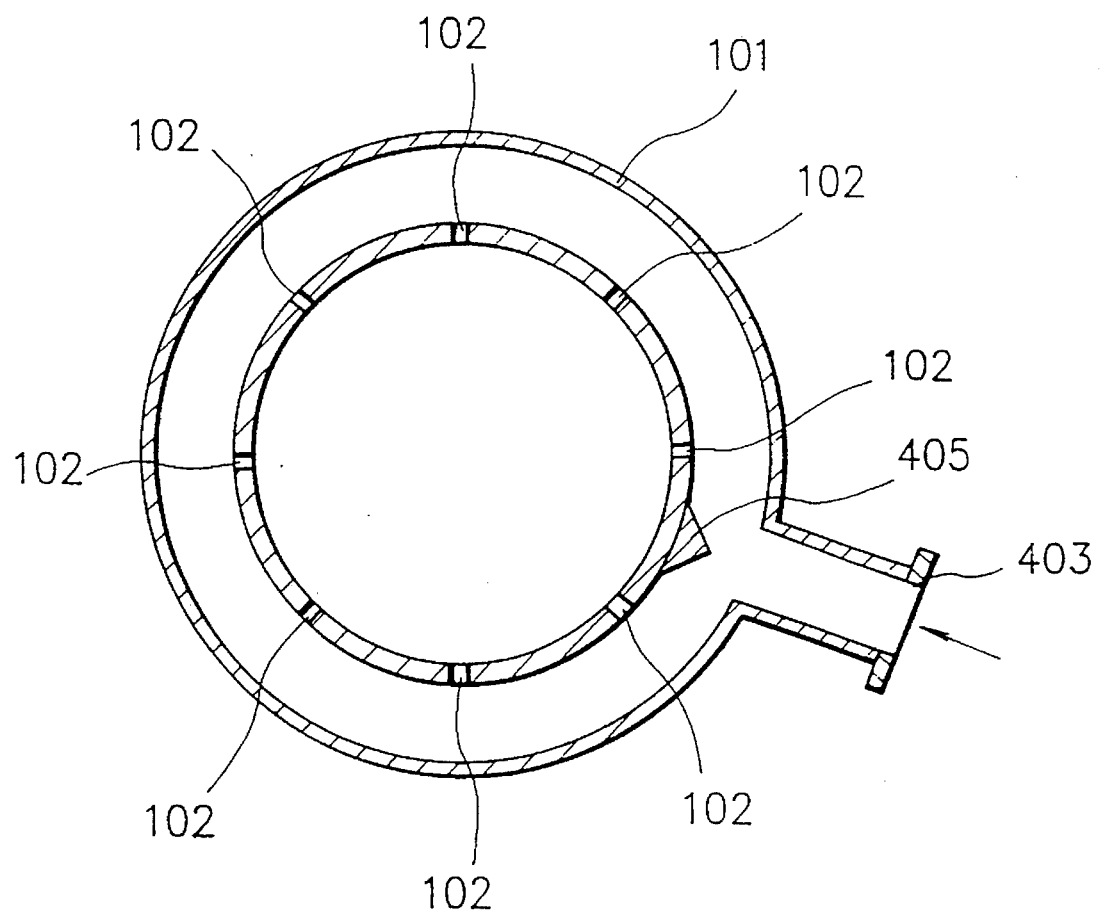
FIG. 4(A) is a schematic view illustrating the configuration of a further example of a microwave introducing device according to the present invention.
FIG. 4(B) is a graph for explaining the principles of the microwave introducing device used in Experiment 4 which was conducted upon accomplishing the present invention.
FIG. 4C is a graph showing the results obtained in Experiment 4 which was conducted upon accomplishing the present invention.
Figure 4:
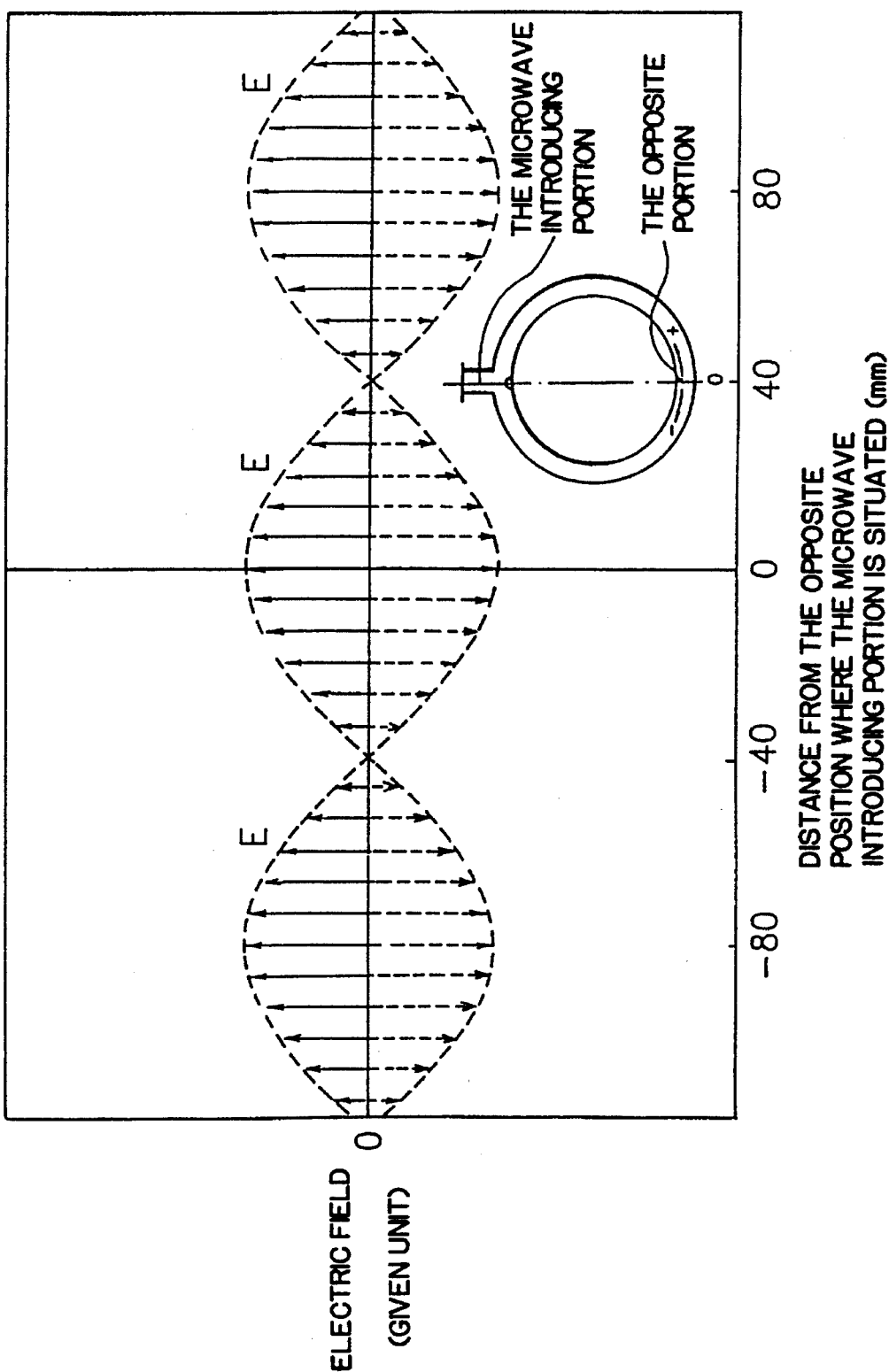
Figure 4:
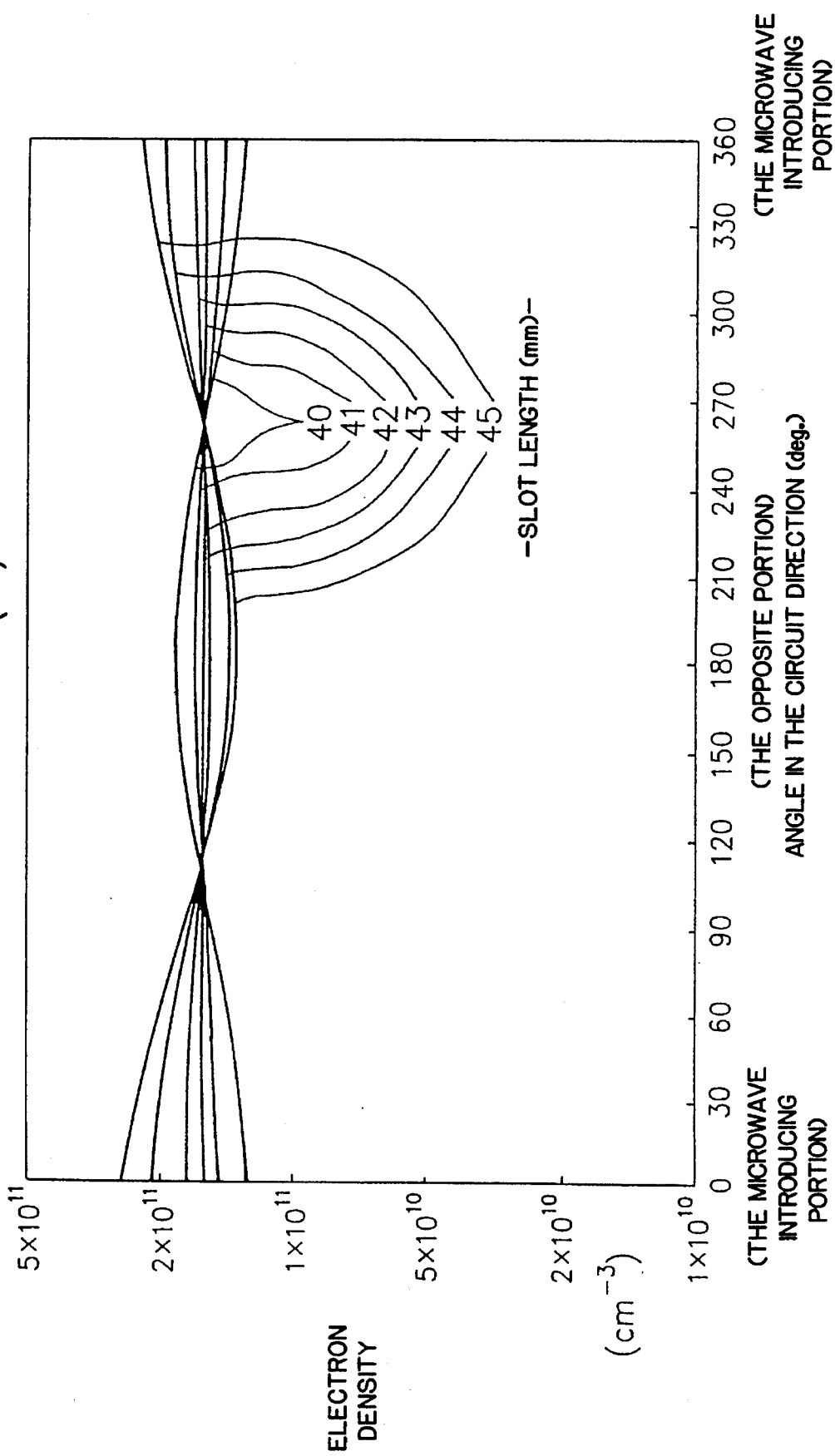

As the above cylindrical microwave introducing device, there was used a cylindrical microwave introducing device of the configuration shown in FIG. 4(A), wherein reference numeral 101 indicates a cylindrical waveguide, reference numeral 102 indicates a plurality of slots spacedly formed at the inner side of the cylindrical waveguide 101 which serve to introduce a microwave from the cylindrical waveguide 101 into a plasma generation chamber (not shown), reference numeral 403 indicates a microwave introducing portion connected to the cylindrical waveguide 101 and which serves to transmit a microwave therethrough into the cylindrical waveguide 101, and reference numeral 405 indicates a two-way delivery block which serves to divide a microwave introduced so that the microwave transmits in the opposite sides in the cylindrical waveguide. The cylindrical waveguide 101 is dimentioned to have an inside wall cross section size of 27 mm×96 mm, which is the same as that of the waveguide under the WRT-2 standard, and a central diameter of 354 mm. The cylindrical waveguide 101 is constituted by stainless steel so as to have a desirable mechanical strength, and the inside wall face thereof is applied with a coating comprising a copper layer and a silver layer by means of a conventional metal plating technique for the purpose of preventing occurrence of transmission loss of a microwave.

Each of the slots of the cylindrical waveguide is shaped in a rectangular form. The number of the slots is 28, and they are spaced at an equal interval of about 40 mm.

In this experiment, as the above cylindrical waveguide, there were used six different cylindrical waveguides each being different with regard to length for the 28 slots. Specifically, their slots were of a length of 40, 41, 42, 43, 44, and 45 mm, respectively.

The microwave introducing portion 103 is connected to a microwave power source with a frequency of 2.45 GHz through a four-stub tuner, a directivity coupling device and an isolator (this part is not shown in the figure).

The two-way delivery block 405 is made of aluminum, and it is shaped in a right-angled isosceles triangle prism form having two reflection faces being at right angles to each other. The long side of the right-angled isosceles triangle prism is of a width (specifically, 27 mm) equivalent to the width of the inner side wall of the cylindrical waveguide 101, and it is disposed such that each of the two reflection faces is at 45° to the microwave passageway of the microwave introducing portion 403 and the center thereof corresponds to the center of the microwave passageway of the microwave introducing portion 403.

The generation of plasma and the measurement of the density distribution of the plasma generated were conducted respectively in the same manner as in Experiment 1, wherein each of the above cylindrical microwave introducing devices of the configuration shown in FIG. 4(A) was installed in the plasma treating apparatus shown in FIG. 1(B).

Upon the generation of plasma, a microwave introduced through the microwave introducing portion was divided in two ways, and the thus divided microwaves respectively transmitted in the opposite sides of the cylindrical waveguide 101, wherein they were strongly interfered with each other in the vicinity of the position opposite the microwave introducing portion (this position is apparent with reference to FIG. 4(A)) to cause a so-called belly having a strong electric field at an interval corresponding to a ½ of the guide wavelength of the microwave, and the slots 102 in conformity with the belly allowed significant introduction of a microwave into the plasma generation chamber 111, whereby high density plasma regions were caused at an interval corresponding to a ½ of the guide wavelength of the microwave.

The generation of plasma and the measurement of plasma density distribution in the circuit direction were conducted for each of the six cylindrical waveguides 101 each being different in terms of length for the slots 102.

Thus, there were obtained the measured results with regard to plasma density distribution in the circuit direction.

The results obtained are graphically shown in FIG. 4(C). From the results, the following facts are understood. That is, in the case where the slots are of a relatively long length (for example, a length of 45 mm), microwave leakage is large at each slot, and because of this, there is a tendency that the microwave introduced is mostly introduced into the plasma generation chamber through the slots situated in the vicinity of the microwave introducing portion 403, wherein a dense plasma density region is occurred in the vicinity of the microwave introducing portion 403. In the case where the slots are of a relatively short length (for example, a length of 40 mm), microwave leakage is small at each slot, and because of this, there is a tendency that the microwave introduced is slightly introduced into the plasma generation chamber through the slots 102 situated in the vicinity of the microwave introducing portion 403 and on the other hand, it is greatly introduced thereinto through other slots situated at the opposite position where strong interference of microwave is caused, wherein a dense plasma density region is occurred at the area opposite the microwave introducing portion 403. In the case where the slots are of a length in the range of 41 mm to 43, there is provided a substantially uniform plasma density distribution. Particularly, in the case where the slots are of a length of 42 mm, the uniformity of plasma density distribution is improved as much as ±5%, which is apparently higher than that in the case of using the cylindrical waveguide used in Experiment 3. And as a result of examining the plasma density itself, it was found to be $1.5 \times 10^{11}$ cm$^{-3}$ cm on average.

The optimum value b 42mm for the slot length which was found out in this experiment is a specific value in relation to the guide circuit length and the guide wavelength of microwave (the guide circuit length=7 times the guide wavelength of microwave) of the cylindrical waveguide used in this experiment, and therefore, it is not always applicable for other cylindrical waveguides. In general, in the case where the ratio between the guide wavelength of microwave and the guide circuit length of a cylindrical waveguide is relatively large, it is necessary to transmit a microwave with an increased frequency, and because of this, it is necessary for each of the slots to be shortened so that microwave leakage can be reduced. On the other hand, in the case where the ratio between the guide wavelength of microwave and the guide circuit length of a cylindrical waveguide is relatively small, it is necessary for each of the slots to be enlarged. In general, in the case where the ratio of the guide circuit length to the guide wavelength of a cylindrical waveguide is 3 to 24 times, the optimum slot length is a value in the range of ¼ to ⅜ of the guide wavelength of microwave, specifically, in the case of the cylindrical waveguide (the guide wavelength of microwave: about 159 mm) used in this experiment, it is a value in the range of 40 mm to 60 mm.

On the basis of the results obtained in this experiment, there was found that the configuration in which the microwave introducing portion 403 is made perpendicular to the cylindrical waveguide 101, a microwave introduced is divided to transmit in two ways in the vicinity of the microwave introducing portion so that the respective microwaves divided transmit in the opposite sides in the cylindrical waveguide 101, slots are disposed to conform to a belly caused as a result of the divided microwaves being interfered with each other, and the slots are optimized with regard to their length to make it possible to introduce a microwave into the plasma generation chamber in a substantially uniform state, wherein plasma is generated in a uniform state.

Experiment 5

This experiment was conducted to find out whether or not a desirable effect is provided with regard to the density distribution of plasma in the plasma generation space when a magnetic field is employed.

In this experiment, there was used a cylindrical microwave introducing device provided with a magnetic field generating means to be situated beside the periphery of the quartz plasma generation chamber. Plasma was generated in the plasma generation chamber by introducing a microwave thereinto through this cylindrical microwave introducing device, wherein the spatial density distribution of the plasma in the circuit direction was examined by means of a conventional probe method. The results obtained were compared with the results obtained in Experiment 4 in which the cylindrical microwave introducing device with no magnetic field generating means.

Figure 5:
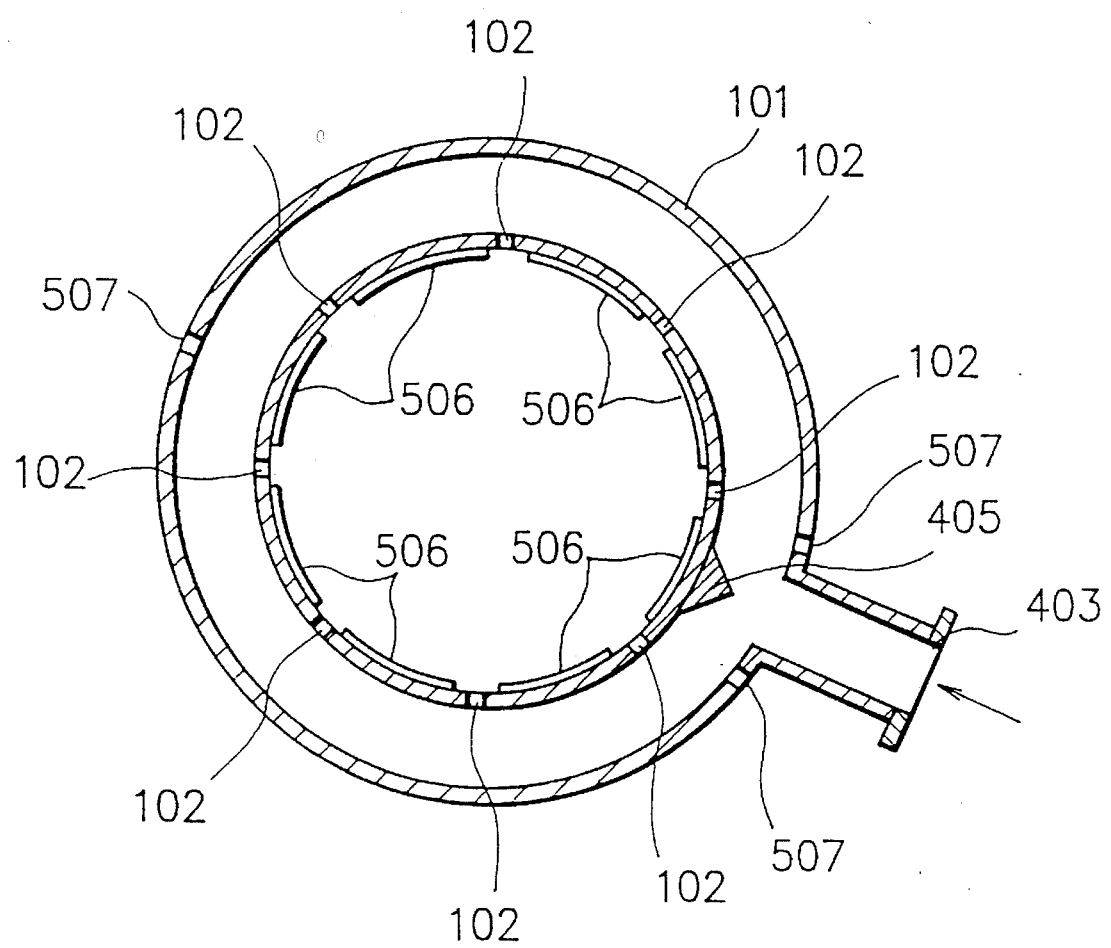
FIG. 5(A) is a schematic view illustrating the configuration of a further example of a microwave introducing device according to the present invention.
FIG. 5(B) is a graph showing the results obtained in Experiment 5 which was conducted upon accomplishing the present invention.

The cylindrical microwave introducing device used in this experiment is of the configuration shown in FIG. 5(A). In the figure, reference numeral 101 indicates a cylindrical waveguide, reference numeral 102 indicates a plurality of slots spacedly formed at the inner side of the cylindrical waveguide 101 which serve to introduce a microwave from the cylindrical waveguide 101 into a plasma generation chamber (not shown), reference numeral 403 indicates a microwave introducing portion which is perpendicularly connected the cylindrical waveguide 101 and which serves to transmit a microwave therethrough into the cylindrical waveguide 101, reference numeral 405 indicates a two-way delivery block which serves to divide a microwave introduced so that the microwave transmits in the opposite sides in the cylindrical waveguide 101, reference numeral 506 indicates a plurality of magnets each serving to generate a magnetic field in parallel to the inner wall face of the plasma generation chamber in the vicinity of the corresponding slot 102, and reference numeral 507 indicates an air cooled means which serves to prevent the magnets 506 from being deteriorated due to overheating.

The cylindrical microwave introducing device shown in FIG. 5(A) comprises a partial modification of the cylindrical microwave introducing device used in Experiment 4 in which the magnets and the air cooled means are added to the latter, and other constitutions than this are the same as those described in Experiment 4.

In this experiment, there were used permanent magnets as the magnets 506. Each of these permanent magnets comprises a plate-like shaped permanent magnet of 45 mm× 10 mm×1.5 mm in size which is commercially available under the trademark name NEOMAX 40 produced by Sumitomo Special Metals Co., Ltd. Each of these permanent magnets is fixed to the corresponding area between each adjacent slots 102 of the cylindrical waveguide 101 using an electroconductive adhesive. Each of these permanent magnets generates a magnetic field with a flux density of about 0.1 T in parallel to the inner wall face of the quartz tube 112.

The generation of plasma and the measurement of the density distribution of the plasma generated were conducted respectively in the same manner as in Experiment 1, wherein the cylindrical microwave introducing device shown in FIG. 5(A) was installed in the plasma treating apparatus shown in FIG. 1(B). Upon the generation of plasma, electrons of the plasma generated caused E×B drifts due to the magnetic fields generated by the permanent magnets 506, whereby plasma with a high density was generated.

The results obtained with regard to density distribution of the plasma in the circuit direction are graphically shown in FIG. 5(B). From the results shown in FIG. 5(B), the following facts are understood. That is, the uniformity of plasma density distribution is as much as ± 6%, which is similar to that in the case of using the cylindrical waveguide used in Experiment 3. However, as a result of examining the plasma density itself, it was found to be high as much as $3\times10^{11}$ cm$^{-3}$ on average.

On the basis of the results obtained in this experiment, there was found that in the case of using the magnetic field generating means capable of generating a magnetic field with a flux density of about 0.1 T in parallel to the inner wall face of the quartz tube 112 situated in the vicinity of the corresponding slots, there can be generated uniform plasma with a high density confined in the vicinity of the cylindrical waveguide.

Experiment 6

This experiment was conducted for the purpose of examining the suitability of a rectangular waveguide to be used for a rectangular plasma generation chamber in terms of plasma density distribution. In this experiment, using a rectangular waveguide, a microwave was introduced into the rectangular plasma generation chamber made of a quartz through the periphery thereof to generate plasma therein, and the spatial density distribution of the plasma generated was measured by means of a conventional probe method.

Figure 6:
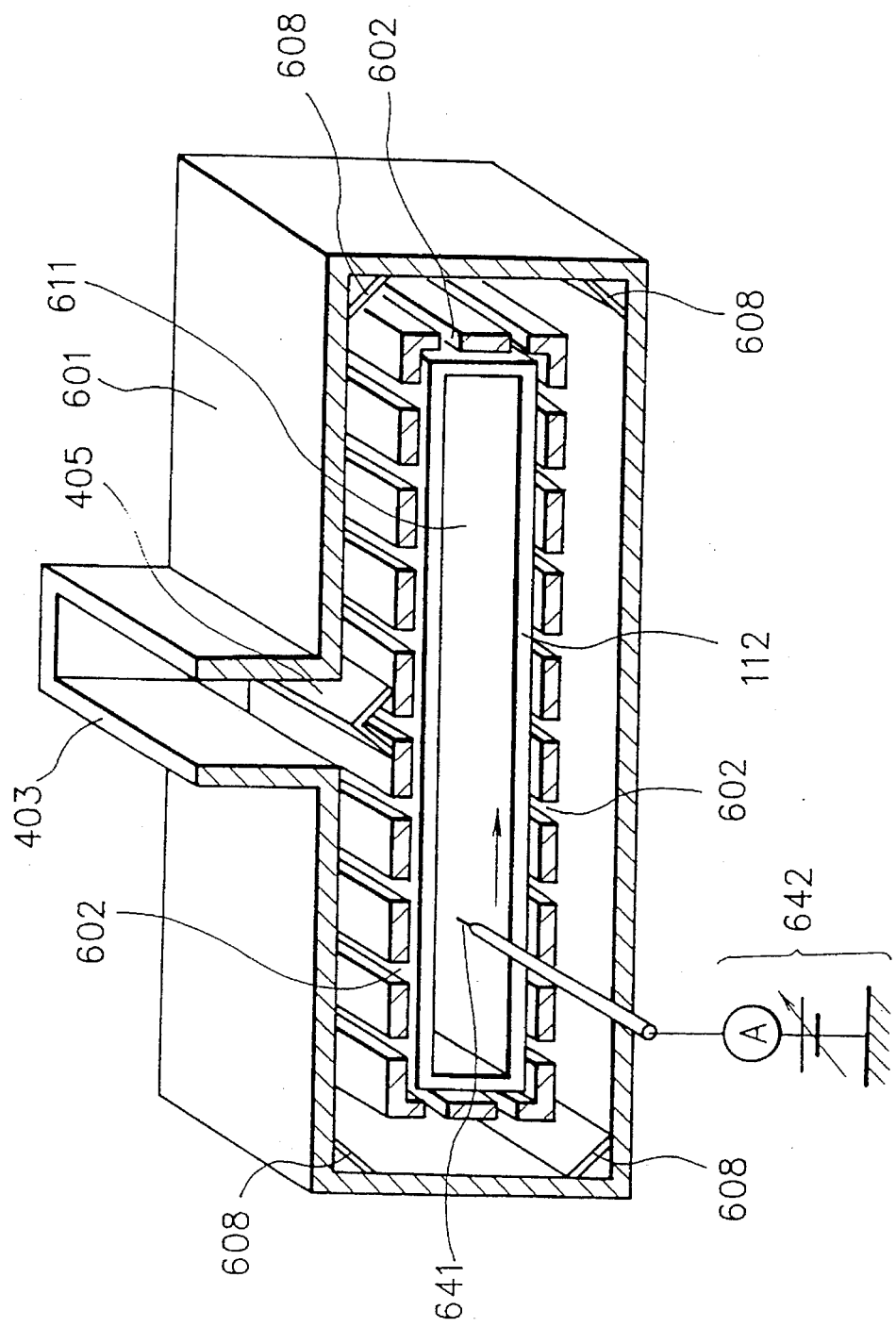
FIG. 6(A) is a schematic view illustrating the configuration of a further example of a microwave introducing device according to the present invention.
FIG. 6(B) is a graph showing the results obtained in Experiment 6 which was conducted upon accomplishing the present invention.

In this experiment, there was used a rectangular microwave introducing device shown in FIG. 6(A). In the figure, reference numeral 601 indicates a rectangular waveguide, reference numeral 602 indicates a plurality of slots spacedly formed at the inner side of the rectangular waveguide 601 which serve to introduce a microwave from the rectangular waveguide 601 into a plasma generation chamber (not shown), reference numeral 603 indicates a microwave introducing portion which is perpendicularly connected to the rectangular waveguide 601 and which serves to transmit a microwave therethrough into the rectangular waveguide 601, reference numeral 405 indicates a two-way delivery block which serves to divide a microwave introduced in two ways such that the respective microwaves divided are transmitted in the opposite sides in the rectangular waveguide 601, and reference numeral 608 indicates a reflection block which is disposed at each of the four corners in the rectangular waveguide 601 wherein the reflection block serves to reflect a microwave so as to efficiently transmit. The reflection block 608 comprises a right-angled isosceles triangle prism made of aluminum having a long side with a width of two times the distance between the opposite inside faces of the rectangular waveguide 601 (specifically, 38 mm) in which the long side serves as a reflection face, and it is disposed such that the reflection face is at 45° to the direction of a microwave to transmit and that the central portion of the long side corresponds to the center of the rectangular waveguide 601.

The generation of plasma and the measurement of the density distribution of the plasma generated were conducted by using a plasma generation apparatus in which the microwave introducing device shown in FIG. 6(A) is installed. FIG. 6(A) illustrates such plasma generation apparatus, wherein reference numeral 611 indicates a plasma generation space, reference numeral 612 indicates a rectangular quartz tube of a size of 660 mm×230 mm in terms of outer size which constitutes said plasma generation space 611, reference numeral 641 indicates a probe made of platinum for measuring the density of plasma generated which is designed to be movable in the longitudinal direction, and reference numeral 642 indicates an I–V characteristic-measuring device which serves to measure an electric current flown when a given voltage is applied to the probe.

The generation of plasma was conducted in the following manner. That is, the plasma generation space 611 was evacuated to a vacuum degree of $10^{-6}$ Torr through an exhaust system (not shown). Nitrogen gas was then introduced through the gas feed pipe 613 into the plasma generation space 611 at a flow rate of 1 slm. Thereafter, the gas pressure of the plasma generation space 611 was adjusted to and maintained at 50 mTorr by regulating a conductance valve (not shown) disposed at the exhaust system. A microwave power source of 2.45 GHz (not shown) was switched on to apply a microwave power of 500 W into the plasma generation space 611 through the rectangular waveguide 601, wherein plasma was generated in the plasma generation space 611. In this case, the microwave introduced was divided by the two-way delivery block 405 in two ways, and the thus divided microwaves respectively transmitted in the opposite sides of the rectangular waveguide 601, wherein they were reflected by the reflection blocks 608, and strongly interfered with each other in the vicinity of the position opposite the microwave introducing portion to cause a so-called belly having a strong electric field at an interval corresponding to a ½ of the guide wavelength of the microwave, and the slots 602 in conformity with the belly allowed significant introduction of a microwave into the plasma generation chamber 611, whereby high density plasma regions were caused at an interval corresponding to a ½ of the guide wavelength of microwave.

The measurement of the density distribution of the plasma generated was conducted in accordance with a conventional Langmuir probe method. That is, a different voltage in the range of −50 V to +50 V was applied to the probe 641, an electric current flown in the probe 641 was measured by the I–V characteristic-measuring device 642 in each case, an I–V curve was obtained based on the measured results, and on the basis of the I–V curve, an electron density was obtained. This procedure was repeated except for changing the position of the probe 641 in the circuit direction in the plasma generation space 611, whereby obtaining the electron density of the plasma in each case. On the basis of the measured results, the density distribution of the plasma in the circuit direction was evaluated.

The results obtained are graphically shown respectively in FIG. 6(B). From the results shown in FIG. 6(B), the following facts are understood. That is, the density of the plasma generated is relatively high in each of the opposite side zones of the plasma generation space but it is substantially uniform in the remaining zone. And the plasma density was found to be $1.2 \times 10^{11}$ cm$^{-3}$ on average.

On the basis of the results obtained in this experiment, it was found that even in the case where the rectangular waveguide was used instead of the cylindrical waveguide, uniform and efficient introduction of a microwave into a plasma generation chamber can be attained by disposing appropriate microwave reflecting members at desired positions.

On the basis of the foregoing results obtained in Experiments 1 to 6, there were obtained the following findings. That is, (i) the use of a cylindrical waveguide which is provided with a plurality of slots each functioning to allow a microwave to enter into a plasma generation chamber, said plurality of slots being spacedly arranged at an interval corresponding to a ¼ of the guide wavelength of microwave, and which is also provided with a microwave introducing portion serving to introduce a microwave into said cylindrical waveguide makes it possible to uniformly and efficiently introduce a microwave into the plasma generation chamber while markedly reducing occurrence of microwave reflection; (ii) in the case where the slots are dimensioned such that their length is gradually increased along the direction of a microwave to transmit, the uniformity of the density of plasma generated in the circuit direction is improved; (iii) in the case of using a cylindrical waveguide which is provided with a plurality of slots each functioning to allow a microwave to enter into a plasma generation chamber, said plurality of slots being spacedly arranged at an interval corresponding to a ¼ of the guide wavelength of microwave, which is also provided with a microwave introducing portion serving to introduce a microwave into said cylindrical waveguide, said microwave introducing portion being perpendicularly connected to said cylindrical waveguide, and which is further provided with a two-way delivery block serving to divide a microwave introduced in two ways and to facilitate the microwaves divided to transmit in the opposite sides in said cylindrical waveguide, and wherein the slots are optimized with regard to their length distribution, plasma is generated in a substantially uniform state in the circuit direction; (iv) in the case where a magnetic field generating means capable of generating a magnetic field in parallel to the inside wall face of the quartz plasma generation chamber is disposed between each pair of the adjacent slots, the density of plasma generated is improved while maintaining the plasma density distribution in a uniform state in the circuit direction; (v) in the case of using a rectangular waveguide which is provided with a plurality of slots each functioning to allow a microwave to enter into a plasma generation chamber, said plurality of slots being spacedly arranged at an interval corresponding to a ¼ of the guide wavelength of microwave, which is also provided with a microwave introducing portion serving to introduce a microwave into said cylindrical waveguide, said microwave introducing portion being perpendicularly connected to said waveguide, which is further provided with a two-way delivery block serving to divide a microwave introduced in two ways and to facilitate the microwaves divided to transmit in the opposite sides in said cylindrical waveguide, and which is still further provided with a reflection block disposed at each of the corners, said reflection block serving to facilitate a microwave to reflect and to efficiently transmit, it is possible to generate plasma in a uniform state and at a high density also in the case where the plasma generation chamber is not in a cylindrical form but in a rectangular form.

DESCRIPTION OF THE PREFERRED EMBODIMENTS

The microwave introducing device according to the present invention comprises an endless circular waveguide capable of circumscribing a plasma generation chamber, a microwave introducing portion serving to introduce a microwave into said waveguide, and a plurality of slots spaced at an interval corresponding to a ¼ of the guide wavelength of microwave at the inner side wall face of said waveguide to be situated beside said plasma generation chamber. Particularly, the present invention is characterized in that said microwave introducing portion is perpendicularly connected to said waveguide, and said microwave introducing portion is configured such that a microwave introduced can be divided in two ways and the microwaves divided are transmitted respectively in the opposite sides in said waveguide.

The plasma treating apparatus according to the present invention is characterized by comprising a plasma generation chamber and a microwave introducing device disposed to circumscribe said plasma generation chamber, said microwave introducing device comprising a waveguide shaped in a circular form, a microwave introducing portion serving to introduce a microwave into said waveguide, and a plurality of slots spacedly arranged at an interval corresponding to a ¼ of the guide wavelength of microwave at the inner side wall face of said waveguide situated beside said plasma generation chamber, wherein said microwave introducing portion is perpendicularly connected to said waveguide, and said microwave introducing portion is configured such that a microwave introduced can be divided in two ways and the microwaves divided are transmitted respectively in the opposite sides in said waveguide.

The microwave used in the microwave introducing device according to the present invention may be of a frequency in the range of 0.8 GHz to 20 GHz, although there was used the microwave with a frequency of 2.45 GHz in the foregoing experiments.

The shape of the endless waveguide used in the present invention can include, other than such cylindrical shape and rectangular shape as used in the foregoing experiments, polygonal shapes and the like, which should be, however, decided depending upon the shape of the plasma generation chamber used. As for the cross section size of the endless circular waveguide, although there was employed the size and the rectangular cross section shape similar to those of the waveguide under the WRT-2 standard in the foregoing experiments, the size can be properly modified as desired and the rectangular cross section shape can be changed to a round shape or a semicircular shape depending upon the situation as long as a microwave can be transmitted in the waveguide as desired. However, in any case, in order to ensure the uniformity of the density of plasma generated, the guide circuit length is desired to be 3 to 24 holds over the guide wavelength of microwave in terms of integral number.

As for the material by which the endless circular waveguide is constituted, it can include, other than the materia comprising a stainless steel applied with a two-layered coat comprising a copper layer and a silver layer used in the foregoing experiments, materials comprising a metal selected from the group consisting of Cu, Al, Fe, and Ni or an alloy selected from the group consisting of alloys of said metals or an insulating material selected from the group consisting of glasses, quartz, silicon nitride, alumina, acrylic resin, polycarbonate, polyvinyl chloride, and polyimide and a metal thin film of Al, W, Mo, Ti, Ta, Cu, or Ag formed thereon which have a sufficient mechanical strength and a surface coated by a electroconductive layer with a skin depth for a microwave.

As for the shape of each of the slots disposed in the microwave introducing device according to the present invention, other than the rectangular shape the long edge of which being perpendicular to the direction of a microwave to transmit, having a size long of 40 mm–60 mm× 4 mm which was used in the foregoing experiments, it can be a round shape, a polygonal shape, a dumbbell-like shape or a pentagram-like shape as long as a microwave can be introduced into the plasma generation chamber therethrough. However, in a most preferable embodiment, each of the slots is shaped in a rectangular form having a long edge perpendicular to the direction of a microwave to transmit and which is of 40 mm–60 mm×1 mm–5 mm in size.

As for the length distribution of the slots, it is adjusted so that the leakage of a microwave becomes substantially the same at each of the slots. The adjustment of the length distribution of the slots can be conducted using an electroconductive tape or a shutter means. As for the interval at which the slots are spacedly arranged, other than the interval of a distance corresponding to a ¼ of the guide wavelength of microwave which was employed in the foregoing experiments, it can employ such a distance which corresponds to some integral number times said value. At the position where plasma is not necessary to be generated, it is not always necessary that slots are arranged there. In the foregoing experiments, there were used the apertured slots, but these slots can be replaced by appropriate means capable of allowing a microwave to transmit therethrough such as dielectric windows.

In the microwave introducing device according to the present invention, a magnetic field generating means can be employed in order to effectively accelerate electrons by virtue of E (electric field)×B (magnetic field) drift. As such magnetic field generating means, there can be used any means as long as it can generate a magnetic field which is perpendicular (that is, in parallel to the wall beside the plasma generation chamber) to the electric field in the vicinity of the slots of the endless circular waveguide (which is perpendicular to the wall beside the plasma generation chamber). In the foregoing experiments, there was used a permanent magnet, but it is possible to use an electromagnet. In addition, in the foregoing experiments, there was used a multicusp field, but other than this, there can be used magnetic circuits such as a cylindrical magnetron field, a cylindrical mirror field and the like as long as the E×B drift can be caused. However, the narrower the region where the E×B drift is caused is the more effective in order to confine the plasma, and in this viewpoint, the multicusp field using a permanent magnet or the single cylindrical magnetron field are the most desirable. The flux density can be controlled by properly adjusting the number of permanent magnets used or the arrangement of these permanent magnets or by properly adjusting the polarized densities of the magnets or the distance between the wall beside the plasma generation chamber and the magnets.

In the foregoing experiments, there was used an air-cooled system in order to prevent the magnets from being overheated, but instead of this, other cooling means such as a water-cooled mechanism can be used. Even in the case where no magnet is used, it is desired to use a cooling means in order to prevent the surface layer of the waveguide wall from being oxidized.

Apparatus Embodiments

In the following, description will be made of the microwave introducing device according to the present invention and the plasma treating apparatus provided with the same by illustrating embodiments thereof, which are not intended to restrict the scope of the present invention.

1. Embodiments of the Microwave Introducing Device

Embodiment 1-(1)

FIG. 3(A) is a schematic view illustrating the configuration of an example of a tangentially introducing type cylindrical microwave introducing device according to the present invention. In the figure, reference numeral 101 indicates a cylindrical waveguide, reference numeral 102 indicates a plurality of apertured slots spacedly formed at the inner side of the cylindrical waveguide 101 which serve to introduce a microwave from the cylindrical waveguide 101 into a plasma generation chamber (not shown), and reference numeral 103 indicates a microwave introducing portion serving to transmit a microwave therethrough into the cylindrical waveguide 101, the microwave introducing portion being connected to the cylindrical waveguide 101 in the tangential direction thereof.

The cylindrical waveguide 101 is dimensioned to have an inside wall cross section in a rectangular form of 27 mm×96 mm in size, which is the same as that of the waveguide under the WRT-2 standard, and to have a central diameter of 354 mm. The cylindrical waveguide 101 is constituted by stainless steel in order to have a desirable mechanical strength, and the inside wall face has a two-layered coating thereon comprising a copper layer and a silver layer formed by means of a conventional metal plating technique for the purpose of preventing occurrence of transmission loss of a microwave.

Each of the slots 102 is shaped in a rectangular form of 40 mm to 75 mm in length and 4 mm in width. The length of each of the slots 102 is designed such that their length is gradually increased from 40 mm to 75 mm toward the position opposite the microwave introducing portion 103 with due care so that the magnitude of a microwave to be leaked becomes equivalent at each of the slots. These slots 102 are spacedly apertured at the inner side wall at an equal interval corresponding to a ¼ of the guide wavelength of microwave. The guide wavelength is different depending upon the frequency of a microwave used and the cross section size of the waveguide. In the case where a microwave with a frequency of 2.45 GHz is used and the above-described cylindrical waveguide is used, it is about 159 mm. Specifically, the cylindrical waveguide 101 is provided with 28 slots each being shaped as above described which are spacedly arranged at an interval of about 40 mm.

The microwave introducing portion 103 is connected to a microwave power source with a frequency of 2.45 GHz through a four-stub tuner, a directivity coupling device and an isolator (this part is not shown in the figure).

The cross section size of the microwave introducing portion 103 is the same as that of the cylindrical waveguide in the case shown in FIG. 3(A). But in order to prevent the microwave from reflecting from the cylindrical waveguide 101 to the microwave power source through the microwave introducing portion 103 without reducing the efficiency of introducing a microwave from the microwave introducing portion into the cylindrical waveguide, it is possible to gradually narrow the inside wall size of the microwave introducing portion 103 as it closes the cylindrical waveguide 101. Or the inside wall size of the microwave introducing portion 103 may be constantly narrowed at a given value.

The plasma treatment using the device shown in FIG. 3(A) is conducted, for example, in the following manner. That is, the inside of the plasma generation chamber (not shown in the figure) is evacuated to a desired vacuum degree by means of an exhaust system (not shown in the figure). A plasma generating raw material gas is then introduced into the plasma generation chamber through a gas feed means, and the gas pressure in the plasma generation chamber is adjusted to a desired pressure by means of a conductance valve (not shown in the figure). Thereafter, the microwave power source (not shown in the figure) is switched on to apply a microwave of a desired power into the plasma generation chamber through the cylindrical waveguide 101, wherein plasma is generated in a uniform state in the plasma generation chamber. In this case, the microwave is introduced into the cylindrical waveguide 101 through the microwave introducing portion 103, wherein the microwave transmits chiefly in the tangential direction in the cylindrical waveguide 101, and a given leak magnitude of the microwave is introduced into the plasma generation chamber through each of the slots. The microwave once circulated around transmits again in the cylindrical waveguide while substantially not being reflected. Thus, since the reflection of the microwave is slight in the cylindrical waveguide, the microwave is efficiently introduced into the plasma generation chamber.

Embodiment 1-(2)

FIG. 4(A) is a schematic view illustrating the configuration of an example of a two-way delivery interference type microwave introducing device according to the present invention. This device is based on the findings obtained in the foregoing Experiments 4 and 5.

In the figure, reference numeral 101 indicates a cylindrical waveguide, reference numeral 102 indicates a plurality of apertured slots spacedly formed at the inner side of the cylindrical waveguide 101 which serve to introduce a microwave from the cylindrical waveguide 101 into a plasma generation chamber (not shown), reference numeral 103 indicates a microwave introducing portion serving to transmit a microwave therethrough into the cylindrical waveguide 101, the microwave introducing portion being perpendicularly connected to the cylindrical waveguide 101, and reference numeral 405 indicates a two-way delivery block which serves to divide a microwave introduced through the microwave introducing portion 103 in two ways and to facilitate the microwaves divided transmit respectively in one of the opposite sides in the cylindrical waveguide 101.

The cylindrical waveguide 101 is dimensioned to have an inside wall cross section in a rectangular form of 27 mm×96 mm in size, which is the same as that of the waveguide under the WRT-2 standard, and to have a central diameter of 354 mm. The cylindrical waveguide 101 is constituted by a stainless steel in order to have desirable mechanical strength, and the inside wall face has a two-layered coating thereon comprising a copper layer and a silver layer formed by means of a conventional metal plating technique for the purpose of preventing occurrence of transmission loss of a microwave.

Each of the slots 102 is shaped in a rectangular form of 42 mm in length and 4 mm in width. The cylindrical waveguide 101 is provided with 28 slots 102 each being thus shaped such that they are spacedly apertured at the inner side wall thereof at an equal interval of about 40 mm.

The microwave introducing portion 103 is connected to a microwave power source with a frequency of 2.45 GHz through a four-stub tuner, a directivity coupling device and an isolator (this part is not shown in the figure).

The two-way delivery block 405 is made of aluminum, and it is shaped in a right-angled isosceles triangle prism form having two reflection faces being at right angles to each other. The long side of the right-angled isosceles triangle prism is of a width of 27 mm which is equivalent to the width of the inner side wall of the cylindrical waveguide 101, and it is disposed such that each of the two reflection faces is at 45° to the microwave passageway of the microwave introducing portion 403 and the center thereof corresponds to the center of the microwave passageway of the microwave introducing portion 403.

The microwave introducing device in this embodiment may be provided with such a magnetic field generating means as described in the foregoing Experiment 5.

The plasma treatment using the device shown in FIG. 4(A) is conducted, for example, in the following manner. That is, the inside of the plasma generation chamber (not shown in the figure) is evacuated to a desired vacuum degree by means of an exhaust system (not shown in the figure). A plasma generating raw material gas is then introduced into the plasma generation chamber through a gas feed means, and the gas pressure in the plasma generation chamber is adjusted to a desired pressure by means of a conductance valve (not shown in the figure). Thereafter, the microwave power source (not shown in the figure) is switched on to apply a microwave of a desired power into the plasma generation chamber through the cylindrical waveguide 101, wherein plasma is generated in a uniform state in the plasma generation chamber. In this case, the microwave is introduced into the cylindrical waveguide 101 through the microwave introducing portion 103, wherein the microwave thus introduced is divided by the two-way delivery block 405 into the opposite sides of the two-way delivery block 405 and each of the thus divided microwaves separately transmits in the cylindrical waveguide 101 wherein the respective microwaves are strongly interfered with each other to cause a so-called belly having a strong electric field at an interval corresponding to a ½ of the guide wavelength of microwave, and the microwave gets into the plasma generation chamber through each of the slots 102 in conformity with such a belly. The closer the intensities of the two microwaves respectively transmitted from the different direction are, the stronger the interference among them. This makes it possible to introduce a microwave with a relatively strong intensity into a zone of the plasma generation chamber which is situated opposite the microwave introducing portion. Thus, a microwave can be uniformly introduced into the plasma generation chamber.

Embodiment 1-(3)

FIG. 6(A) is a schematic view illustrating the configuration of an example of a two-way delivery interference type microwave introducing device according to the present invention. This device is based on the findings obtained in the foregoing Experiment 6.

In the figure, reference numeral 601 indicates a rectangular waveguide, reference numeral 602 indicates a plurality of apertured slots spacedly formed at the inner side of the rectangular waveguide 601 which serve to introduce a microwave from the rectangular waveguide 601 into a plasma generation chamber (not shown), reference numeral 403 indicates a microwave introducing portion which is perpendicularly connected to the rectangular waveguide 601 and which serves to transmit a microwave therethrough into the rectangular waveguide 601, reference numeral 405 indicates a two-way delivery block which serves to divide a microwave introduced into the microwave introducing portion 403 in two ways and to facilitate the microwaves divided transmit respectively in one of the opposite sides in the rectangular waveguide 601, and reference numeral 608 indicates a reflection block which is disposed at each of the four corners in the rectangular waveguide 601 wherein the reflection block serves to reflect a microwave so as to efficiently transmit.

The rectangular waveguide 601 is dimensioned to have an inside wall cross section in a rectangular form of 27 mm× 96 mm in size, which is the same as that of the waveguide under the WRT-2 standard, and which is 722 mm×292 mm in outer size. The rectangular waveguide 601 is constituted by a stainless steel in order to have a desirable mechanical strength, and the inside wall face has a two-layered coating thereon comprising a copper layer and a silver layer formed by means of a conventional metal plating technique for the purpose of preventing occurrence of transmission loss of a microwave.

Each of the slots 602 is shaped in a rectangular form of 41 mm in length and 4 mm in width. The rectangular waveguide 601 is provided with 46 slots 602 each being thus shaped such that they are spacedly apertured at the inner side wall thereof at an equal interval of about 40 mm.

The microwave introducing portion 403 is connected to a microwave power source with a frequency of 2.45 GHz through a four-stub tuner, a directivity coupling device and an isolator (this part is not shown in the figure).

The two-way delivery block 405 is made of aluminum, and it is shaped in a right-angled isosceles triangle prism form having two reflection faces being at right angles to each other. The long side of the right-angled isosceles triangle prism has a width of 27 mm which is equivalent to the width of the inner side wall of the rectangular waveguide 601, and it is disposed such that each of the two reflection faces is at 45° to the microwave passageway of the microwave introducing portion 403 and the center thereof corresponds to the center of the microwave passageway of the microwave introducing portion 403.

The reflection block 608 comprises a right-angled isosceles triangle prism made of aluminum having a long side with a width of two times the distance between the opposite inside faces of the rectangular waveguide 601 (that is, 38 mm) in which the long side serves as a reflection face, and it is disposed such that the reflection face is at 45° to the direction of a microwave to transmit and that the central portion of the long side corresponds to the center of the rectangular waveguide 601.

The plasma treatment using the device shown in FIG. 6(A) is conducted, for example, in the following manner. That is, the inside of the plasma generation chamber (not shown in the figure) is evacuated to a desired vacuum degree by means of an exhaust system (not shown in the figure). A plasma generating raw material gas is then introduced into the plasma generation chamber through a gas feed means, and the gas pressure in the plasma generation chamber is adjusted to a desired pressure by means of a conductance valve (not shown in the figure). Thereafter, the microwave power source (not shown in the figure) is switched on to apply a microwave of a desired power into the plasma generation chamber through the rectangular waveguide 601, wherein plasma is generated in a uniform state in the plasma generation chamber. In this case, the microwave is introduced into the rectangular waveguide 601 through the microwave introducing portion 403, wherein the microwave thus introduced is divided by the two-way delivery block 405 into the opposite sides of the two-way delivery block 405 and each of the thus divided microwaves separately transmits in the rectangular waveguide 601 while being perpendicularly reflected by the four reflection blocks respectively disposed at each of the four corners wherein the respective microwaves are interfered with each other to cause a so-called belly having a strong electric field at an interval corresponding to a ½ of the guide wavelength of microwave, and the microwave gets into the plasma generation chamber through each of the slots 102 in conformity with such a belly. The closer the intensities of the two microwaves respectively transmitted from the different direction are, the stronger the interference among them. This makes it possible to introduce a microwave with a relatively strong intensity into a zone of the plasma generation chamber which is situated opposite the microwave introducing portion. Thus, a microwave can be uniformly introduced into the plasma generation chamber.

2. Embodiments of the Plasma Treating Apparatus

Embodiment 2-(1)

Figure 7:
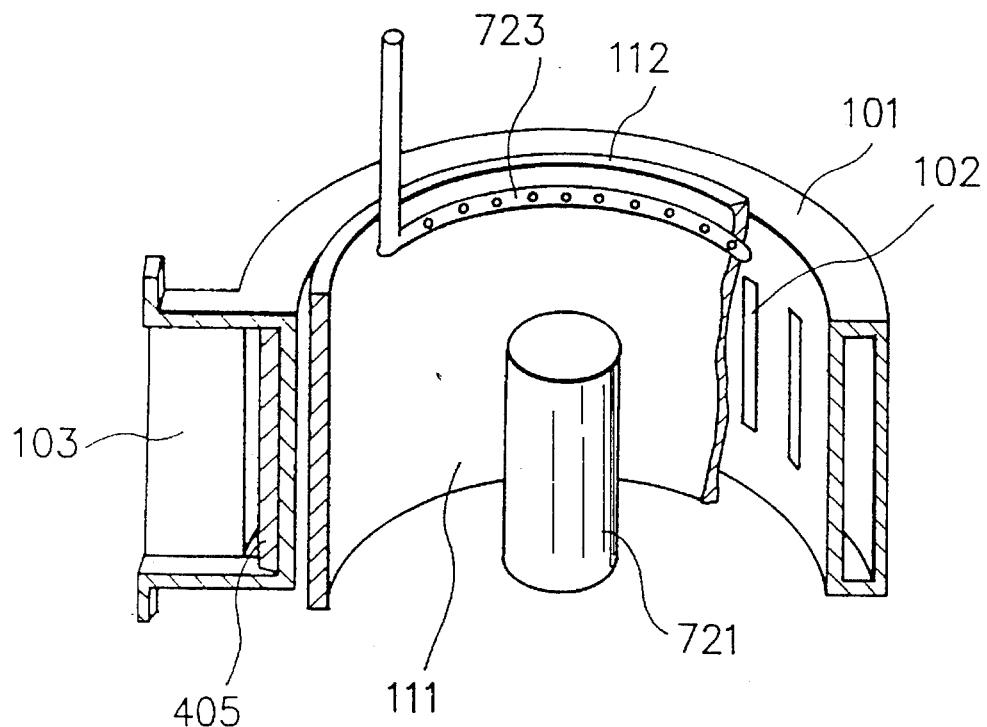
FIG. 7(A) is a schematic view illustrating an example of a plasma treating apparatus according to the present invention.
FIG. 7(B) is a schematic view illustrating another example of a plasma treating apparatus according to the present invention.
Figure 7:
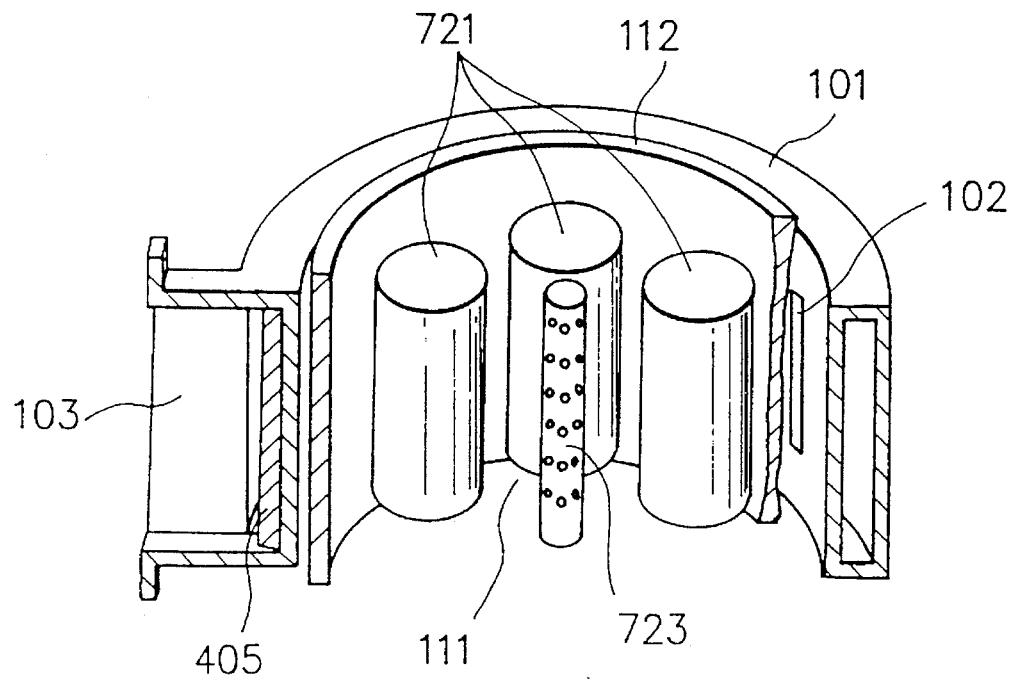

Shown in FIG. 7(A) is a schematic view illustrating an example of a cylindrical plasma CVD apparatus corresponding to an example of the plasma treating apparatus according to the present invention, which is provided with the microwave introducing apparatus shown in FIG. 4(A). In the figure, reference numeral 101 indicates a circular waveguide, reference numeral 102 indicates a slot which serves to introduce a microwave from the circular waveguide 101 into a plasma treating space 111, reference numeral 103 indicates an introduction port which serves to introduce a microwave into the circular waveguide 101, reference numeral 405 indicates a two-way delivery block which serves to divide a microwave introduced in two ways and to facilitate the respective microwaves divided to transmit forward, reference numeral 112 indicates a quartz tube forming the plasma generation space 111, reference numeral 721 indicates a substrate on which a deposited film is to be formed, and reference numeral 723 indicates a gas feed means which serves to a reaction gas into the plasma generation space 111. As the gas feed means 723, there can be employed a ring-like shaped gas feed pipe or a coaxial multiple gas feed pipe.

The formation of a deposited film using the apparatus shown in FIG. 7(A) is conducted, for example, in the following manner. That is, a cylindrical substrate as the substrate 721 for film formation is positioned in the plasma treating space 111, and the inside of the plasma treating space 111 is evacuated to a desired vacuum degree by means of an exhaust system (not shown in the figure). The substrate 721 is then heated to and maintained at a desired temperature by means of a heating means (not shown in the figure). Thereafter, a reaction gas is supplied into the plasma generation space 111 through the gas feed means 723, and the gas pressure in the plasma generation space 111 is maintained at a desired pressure by regulating a conductance valve (not shown in the figure) disposed at the exhaust system. Successively, the microwave power source (not shown in the figure) is switched on to apply a microwave with a desired power into the plasma generation space through the circular waveguide 101. By this, plasma is generated in a uniform state in the plasma generation space 111, wherein the reaction gas introduced through the gas feed means 723 into the plasma generation space 111 is excited and decomposed to produce precursors, which are followed by arriving at the surface of the substrate 721, resulting in forming a deposited film on said surface.

In the apparatus of this embodiment, it is possible to continuously conduct the plasma treating for a plurality of cylindrical substrates 721 while axially moving them.

Embodiment 2-(2)

Shown in FIG. 7(B) is a schematic view illustrating a cylindrical plasma CVD apparatus in which a plurality of cylindrical substrates each being the same kind as the substrate described in Embodiment 2-(1) are arranged. The constitution of the apparatus in this embodiment is the same as that of the apparatus described in Embodiment 2-(1), except the following points that the number of the substrate 721 to be arranged is made plural in this embodiment and a different gas feed means 723 is employed in this embodiment.

In this embodiment, the gas feed means 723 in this embodiment comprises a gas feed pipe provided with a plurality of gas liberation holes, and a plurality of cylindrical substrate 721 are arranged so as to circumscribe the gas feed means in the plasma generation space. Each of the cylindrical substrates 721 is arranged such that it can be rotated on its axis by a rotating means (not shown in the figure).

The apparatus in this embodiment may be designed such that a bias voltage of a direct current or a bias voltage of an alternate current bias can be applied to the gas feed means 723 in order to improve the uniformity of plasma generated. The bias applied in this case should be in the range that the density and electric potential of plasma generated can be controlled. Specifically, there can be employed a direct current voltage in the range of −500 to −200 V or an alternate current voltage with a frequency in the range of 40 Hz to 300 MHz.

Embodiment 2-(3)

Figure 8:
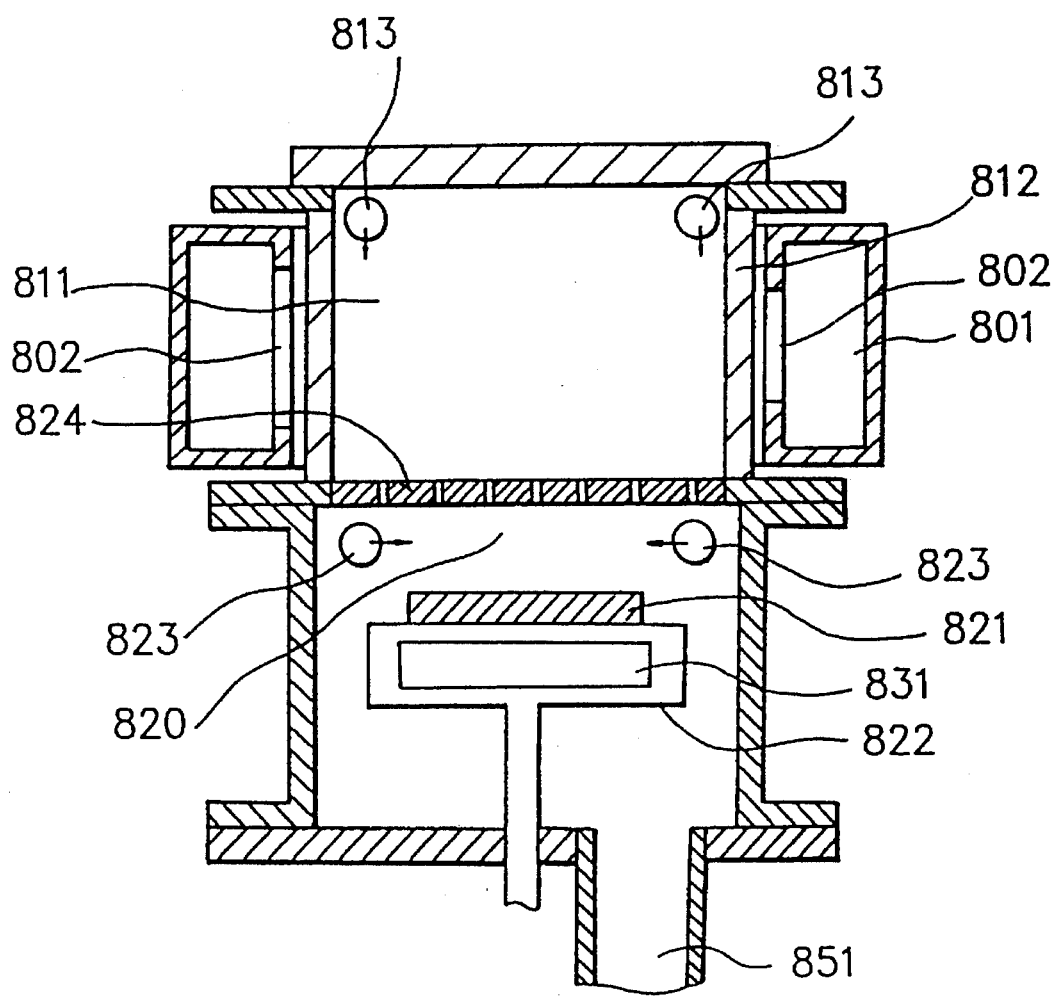
FIG. 8(A) is a schematic view illustrating a further example of a plasma treating apparatus according to the present invention.
FIG. 8(B) is a schematic view illustrating a further example of a plasma treating apparatus according to the present invention.
Figure 8:
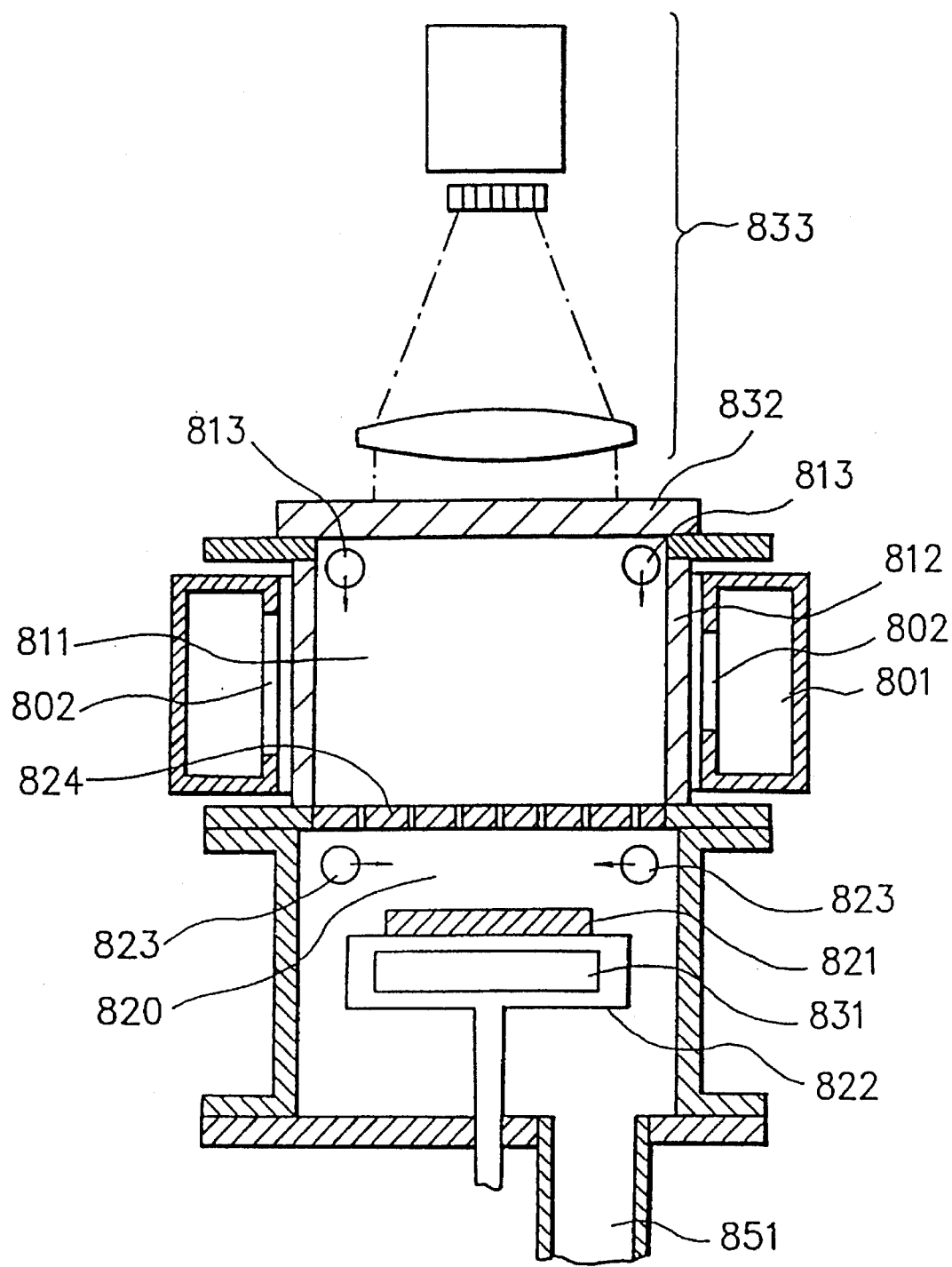

Shown in FIG. 8(A) is a schematic view illustrating an example of a remote plasma CVD apparatus corresponding to an example of the microwave plasma CVD apparatus according to the present invention, which is provided with the microwave introducing device shown in 4(A). In the figure, reference numeral 801 indicates a circular waveguide, reference numeral 802 indicates a slot which serves to introduce a microwave from the circular waveguide 801 into a plasma generation chamber 811, reference numeral 812 indicates a quartz tube constituting the plasma generation space 811, reference numeral 813 indicates a first gas feed means which serves to supply a plasma generating raw material gas into the plasma generation chamber 811, reference numeral 821 indicates a substrate on which a deposited film is to be formed, reference numeral 822 indicates a substrate holder which serves to hold the substrate 821 thereon, reference numeral 823 indicates a second gas feed means which serves to supply a secondary raw material gas into a plasma treating chamber, and reference numeral 824 indicates an isolation plate provided with a plurality of perforations which serves to isolate the plasma generation chamber 811 from the plasma treating chamber 820. The first gas feed means may be any gas feed means as long as it is provided with a gas spouting outlet in contact with plasma generated. Any of the first and second gas feed means may be a ring-like shaped gas feed pipe or a coaxial multiple gas feed pipe.

In the apparatus of this embodiment, the distance between the substrate and the circular waveguide is desired to be in the range of 50 mm to 300 mm.

The formation of a deposited film using the apparatus shown in FIG. 8(A) is conducted, for example, in the following manner. That is, a substrate 821 for film formation is positioned on the substrate holder 822 in the plasma treating chamber 820. The inside of each of the plasma generation chamber 811 and the plasma treating chamber 820 is evacuated to a desired vacuum degree by means of an exhaust system 851. The substrate 821 is then heated to and maintained at a desired temperature by means of a heating means 831. Thereafter, a plasma generating raw material gas is supplied into the plasma generation chamber 811 through the first gas feed means 813, and at the same time, a secondary raw material gas is introduced into the film-forming chamber 820 through the second gas feed means 823. The gas pressure in each of the plasma generation chamber 811 and the film-forming chamber 820 is maintained at a desired pressure by regulating a conductance valve (not shown in the figure) disposed at the exhaust system. Successively, the microwave power source (not shown in the figure) is switched on to apply a microwave with a desired power into the plasma generation chamber 811 through the circular waveguide 101. By this, plasma is generated in a uniform state only in the plasma generation chamber 811, wherein the plasma generating gas introduced through the first gas feed means 813 into the plasma generation chamber 811 is excited and decomposed to produce active species, which are followed by flowing into the film-forming chamber 820 through the perforations of the isolation plate 824, wherein the active species are reacted with the secondary raw material gas introduced through the second gas feed means 823 to produce precursors, which are followed by arriving at the surface of the substrate 821, resulting in forming a deposited film on said surface.

Embodiment 2-(4)

Shown in FIG. 8(B) is a schematic view illustrating an example of a photo-assisted plasma CVD apparatus corresponding to an example of the microwave plasma CVD apparatus according to the present invention, the constitution of which being the same as that of the remote plasma CVD apparatus described in Embodiment 2-(3) except for further comprising a light irradiating means capable of irradiating visible light or ultraviolet rays to the surface of a substrate. In the figure, reference numeral 833 indicates a lighting system for irradiating visible light or ultraviolet rays to the surface of a substrate 821, reference numeral 832 indicates a light introducing window which serves to introduce visible ultraviolet rays from the lighting system into the film-forming chamber 820 through the plasma generation chamber 811. The lighting system 833 herein comprises a light source, a reflecting mirror capable of condensing light from the light source, an integrator capable of mixing and equalizing the light, and a collimator lens capable of irradiating parallel luminous flux to the light introducing window 832.

According to the apparatus of this embodiment, volatile materials or/and foreign matters deposited on the substrate 821 can be removed by irradiating visible light or ultraviolet rays from the lighting system 833 to the substrate 821, because of this, there can be obtained a high quality deposited film.

As the light source of the lighting system 831, there can be selectively used light sources with a wavelength capable of being absorbed by the precursors deposited on the substrate surface such as low pressure mercury lamp, high pressure mercury lamp, very high pressure mercury lamp, xenon-mercury lamp, xenon lamp, heavy hydrogen lamp, Ar-resonance line lamp, Kr-resonance line lamp, Xe-resonance line lamp, excimer laser, $Ar^+$laser double high frequency, $N_2$ laser, and YAG laser thrice high frequency.

Embodiment 2-(5)

Figure 9:
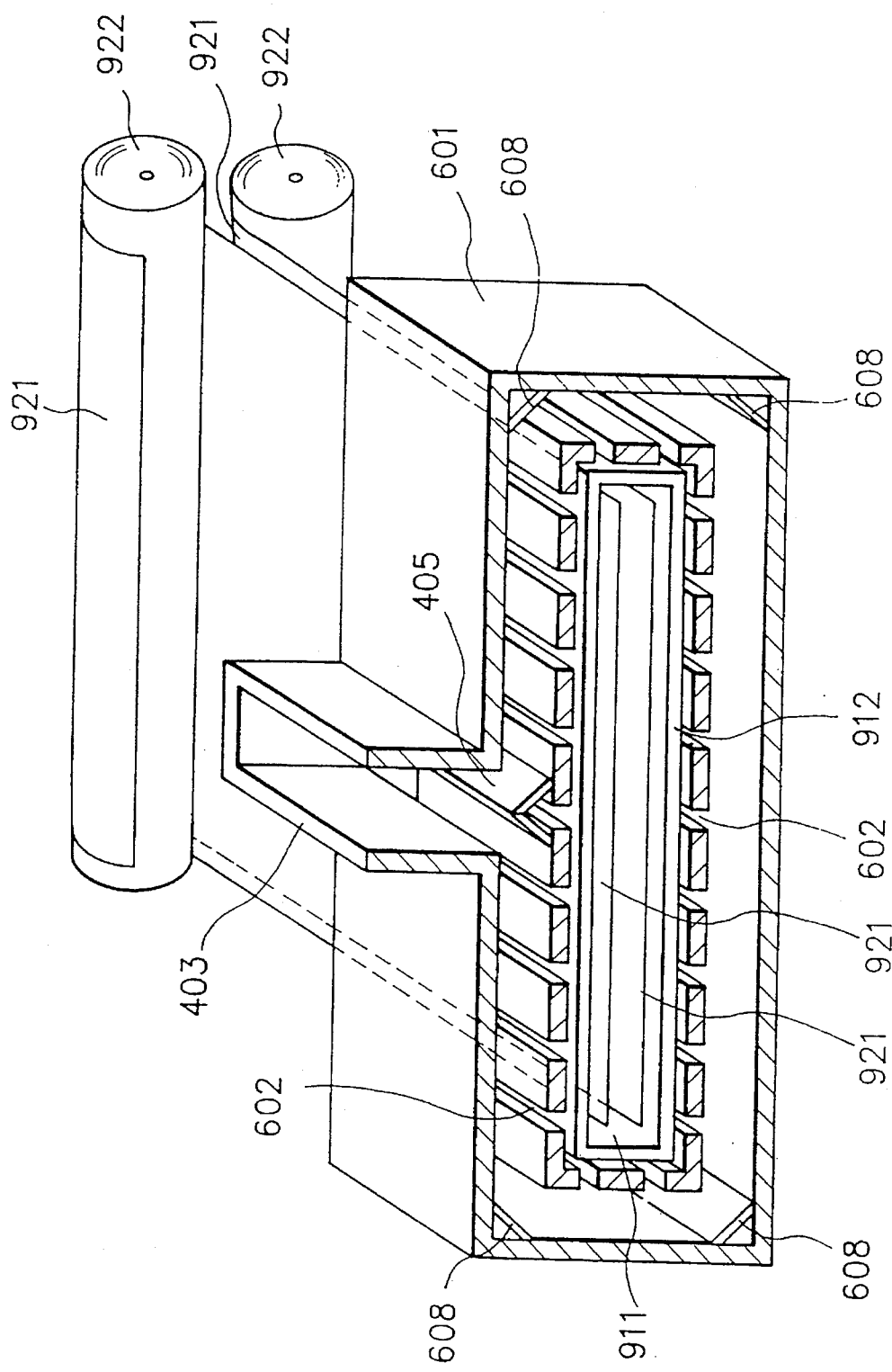
FIG. 9(A) is a schematic view illustrating a further example of a plasma treating apparatus according to the present invention.
FIG. 9(B) is a schematic view illustrating a further example of a plasma treating apparatus according to the present invention.
Figure 9:
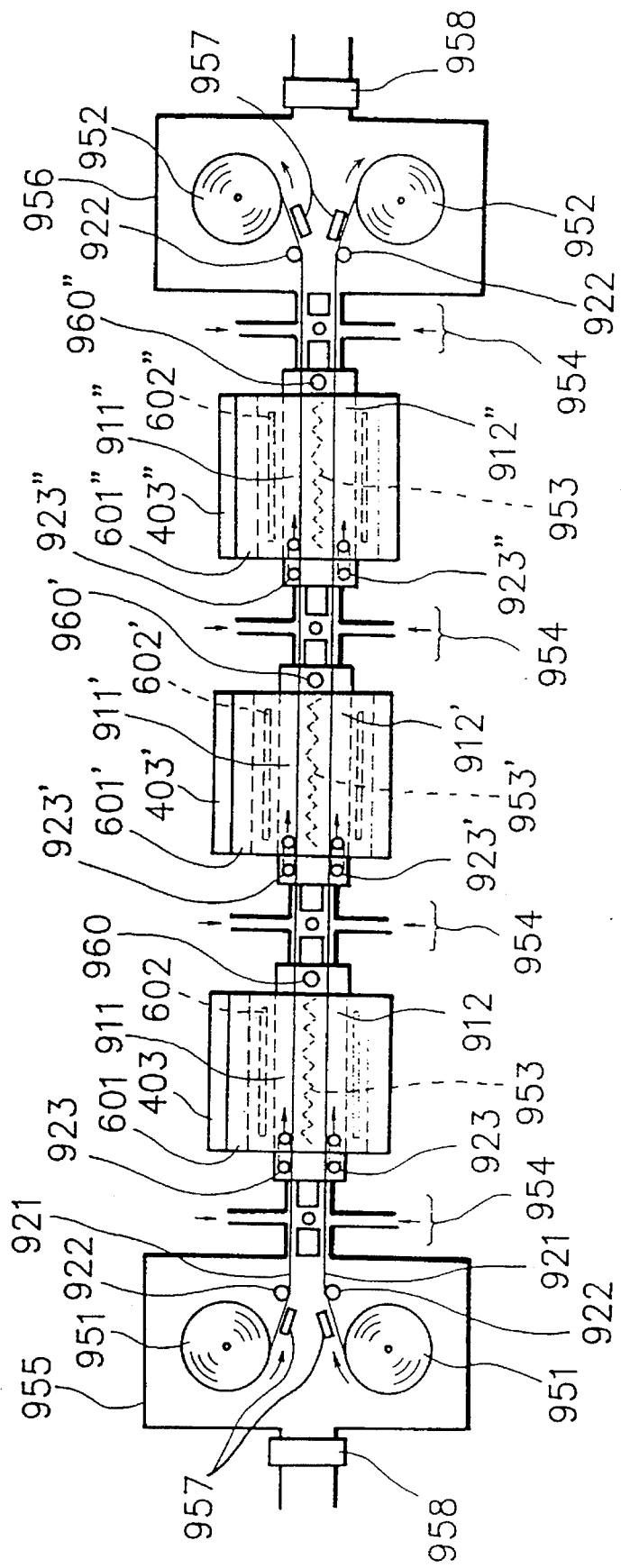
Figure 10:
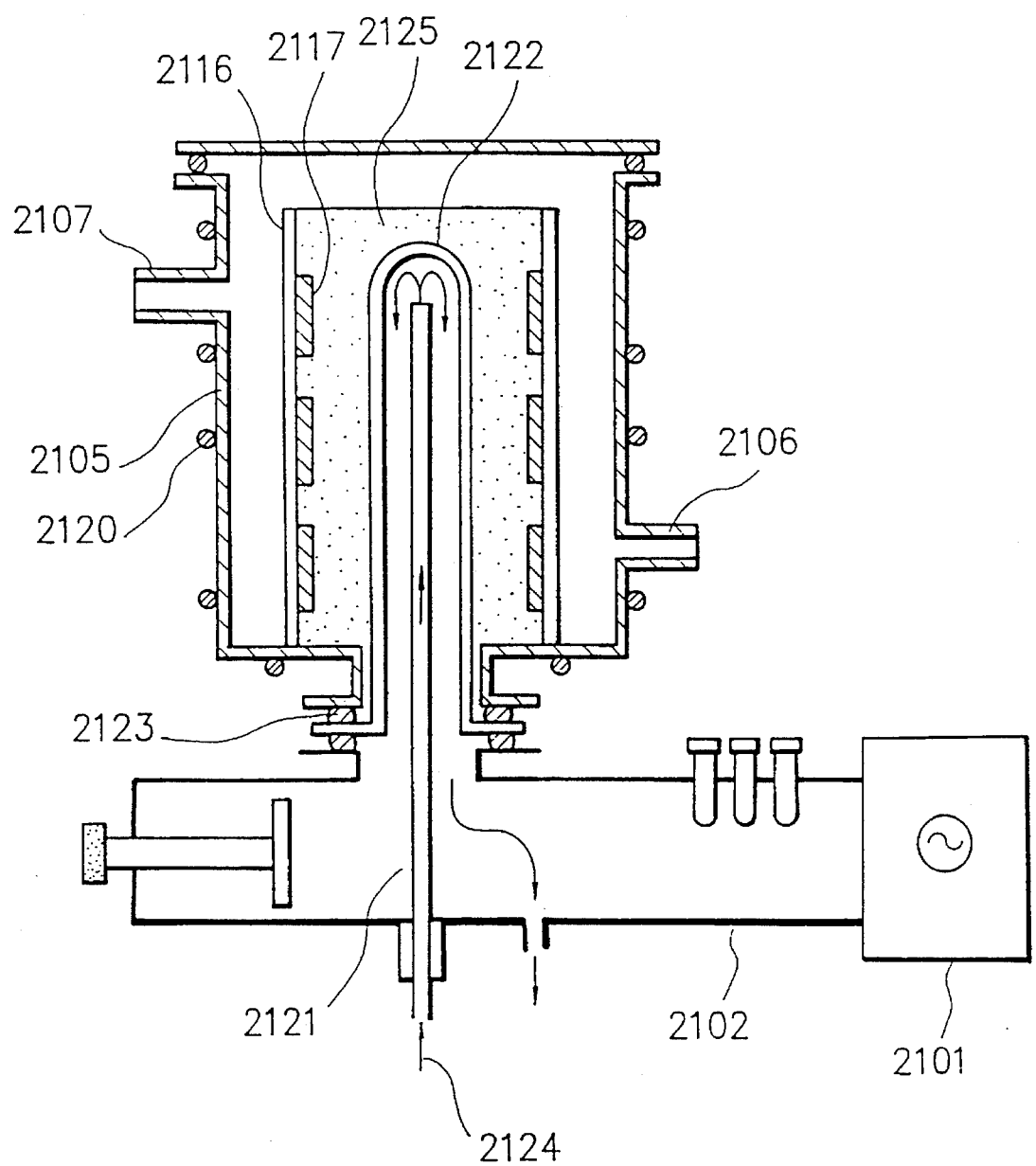
FIG. 10 is a schematic view for explaining the known coaxial antenna type microwave introducing device.
Figure 11:
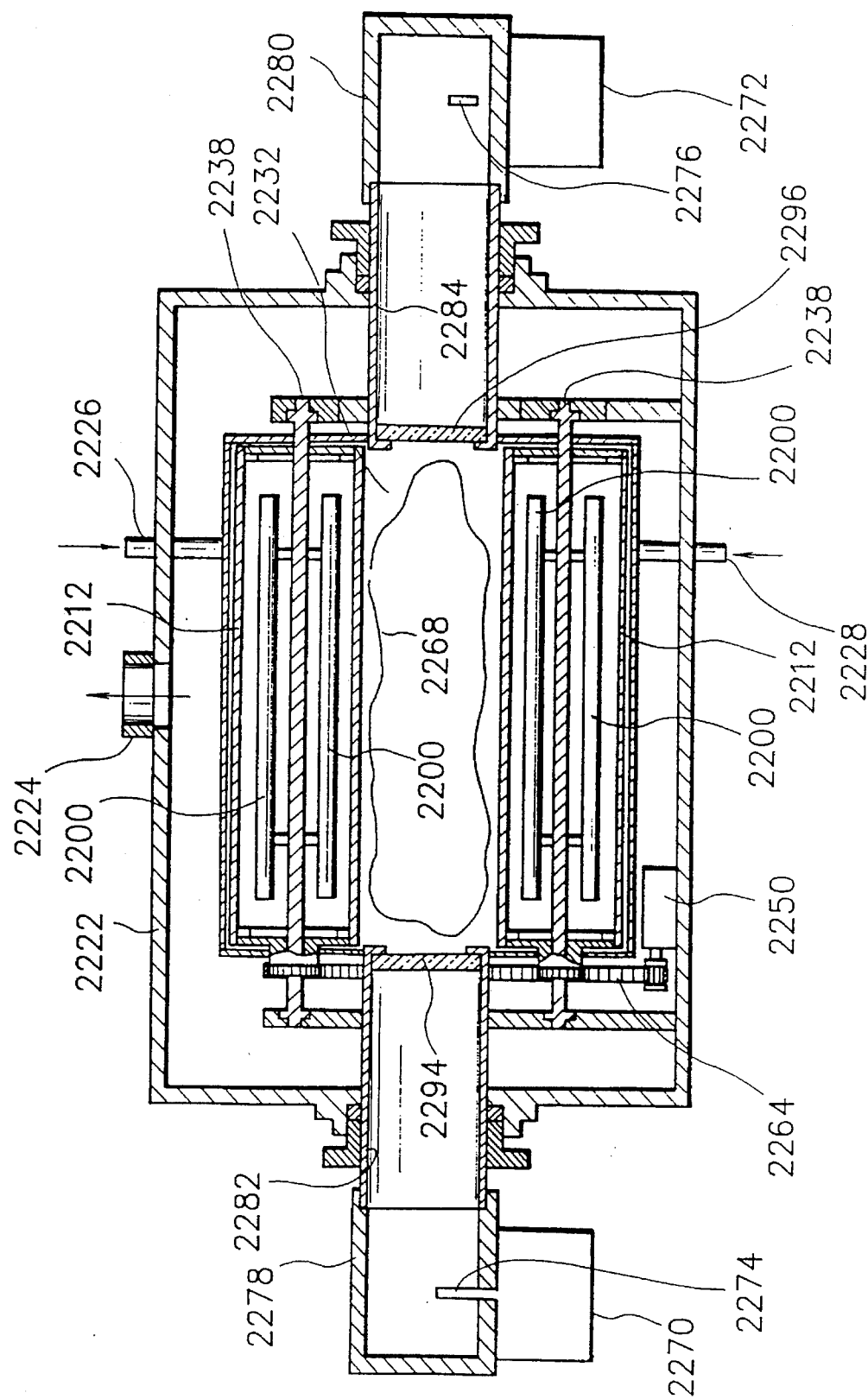
FIG. 11 is a schematic view for explaining the known transmissive window type microwave introducing device.

Shown in FIG. 9(A) is a schematic view illustrating an example of a gate type plasma CVD apparatus corresponding to an example of the microwave plasma CVD apparatus according to the present invention, which is provided with the microwave introducing device shown in 6(A).

In the figure, reference numeral 601 indicates a rectangular waveguide, reference numeral 602 indicates a slot which serves to introduce a microwave from the rectangular waveguide 601 into a plasma generation chamber 911, reference numeral 403 indicates a microwave introducing portion which serves to transmit a microwave therethrough into the rectangular waveguide 601, reference numeral 405 indicates a two-way delivery block which serves to divide a microwave introduced in two ways and to facilitate the microwaves divided transmit respectively in one of the opposite sides in the rectangular waveguide 601, reference numeral 608 indicates a reflection block disposed at each of the four corners of the rectangular waveguide and which serves to perpendicularly reflect a microwave at the corner and to facilitate the microwave to transmit, reference numeral 912 indicates a rectangular quartz tube constituting a plasma treating chamber 911, reference numeral 921 indicates a substrate web on which a deposited film is to be formed, and reference numeral 922 indicates two take-up bobbins each serving to take up the substrate web 921. In the gate type plasma CVD apparatus shown in 9(A), there are arranged two pay-out bobbins (not shown in the figure) each serving to pay out the substrate web at the position opposite the take-up bobbins 922. The pay-out bobbins and the take-up bobbins 922 are housed in respective vacuum vessels (not shown in the figure). And, there are disposed a gas gate (not shown in the figure) between the vacuum vessel in which the pay-out bobbins are positioned and the rectangular quartz tube 921 and another gas gate between the vacuum vessel in which the take-up bobbins are positioned and the rectangular quartz tube 921.

The formation of a deposited film using the apparatus shown in FIG. 9(A) is conducted, for example, in the following manner. That is, the substrate web 921 is paid out from each of the pay-out bobbins (not shown in the figure), it is passed through the gas gate (not shown in the figure), the plasma generation chamber 911 and the another gas gate, and it is fixed to each of the take-up bobbins 922. The inside of each of the vacuum vessel in which the pay-out bobbins are positioned, the plasma treating chamber 911 and the vacuum vessel in which the take-up bobbins are positioned is evacuated to a desired vacuum degree by means of an exhaust system (not shown in the figure). The substrate webs 921 are then heated to and maintained at a desired temperature by means of a heating means (not shown in the figure). Thereafter, a reaction gas is supplied into the plasma treating chamber 911 through a gas feed means (not shown in the figure) while moving the substrate webs 921 at a given transportation speed by rotating the pay-out bobbins and the take-up bobbins 922. A gate gas is flown into the two gas gates, and the gas pressure in the plasma treating chamber 911 is maintained at a desired pressure by regulating an exhaust system (not shown in the figure). Successively, the microwave power source (not shown in the figure) is switched on to apply a microwave with a desired power into the plasma treating chamber 811 through the rectangular waveguide 601. By this, plasma is generated in a uniform state in the plasma treating chamber 911, wherein the reaction gas introduced through the gas feed means into the plasma treating chamber 911 is excited and decomposed to produce precursors, which are followed by arriving at the surface of the each of the substrate webs 921, resulting in forming a deposited film on the surface of each of them.

Embodiment 2-(6)

Shown in FIG. 9(B) is a schematic view illustrating an example of a multiple gate type plasma CVD apparatus corresponding an example of the microwave plasma CVD apparatus according to the present invention, which comprises a plurality of plasma treating chambers of the constitution shown in Embodiment 2-(5) being arranged in series so as to enable continuous formation of a stacked deposited film.

Particularly, the apparatus shown in FIG. 9(B) comprises three plasma treating chambers 911, 911' and 911" which are communicated with each other through gas gates 954, wherein each of the three plasma treating chambers 911, 911' and 911" serves to form a deposited film with a different chemical composition. Reference numeral 955 indicates a substrate pay-out vacuum vessel in which a substrate pay-out bobbin 951 is positioned, and reference numeral 956 indicates a substrate take-up vacuum vessel in which a substrate take-up bobbin 952 is positioned. Reference 922 indicates a roller serving to support and transport a substrate web 921. Reference numeral 957 indicates a temperature adjusting mechanism. Reference numeral 958 indicates a conductance valve serving to regulate the volume of gas exhausted. The substrate web 921 is paid out from the pay-out bobbin 951 is passed through each of the plasma treating chambers 911, 911' and 911", and it is taken up by the take-up bobbin 952.

The plasma CVD apparatus shown in FIG. 9(B) is provided with the microwave introducing device shown in FIG. 6(A) at each of the plasma treating chambers.

Each of reference numerals 923, 923' and 923" indicates a reaction gas feed means, and each of reference numerals 953, 953' and 953" indicates a heating means for heating the substrate web. Each of reference numerals 960, 960' and 960" indicates an exhaust means for each of the plasma treating chambers 911, 911' and 911".

The formation of a deposited film using the apparatus shown in FIG. 9(B) is conducted, for example, in the following manner. That is, the substrate web 921 is paid out from each of the pay-out bobbins 951, it is passed through each of the plasma treating chambers 911, 911' and 911", and it is fixed to each of the take-up bobbins 952. The inside of each of the substrate pay-out vacuum vessel 955, the plasma treating chambers 911, 911' and 911", and the substrate take-up vacuum vessel 956 is evacuated to a desired vacuum degree by means of the exhaust means. The substrate webs 921 are then heated to and maintained at a desired temperature by means of the heating means 953, 953' and 953". Thereafter, a different reaction gas is supplied into each of the plasma treating chambers 911, 911' and 911" through each of the gas feed means 923, 923' and 923" while moving the substrate webs 921 at a given transportation speed by rotating the pay-out bobbins 951 and the take-up bobbins 952. A gate gas is flown into each of the gas gates 954, and the gas pressure in each of the plasma treating chamber 911, 911' and 911" is maintained at a desired pressure by regulating each of the exhaust means 960, 960' and 960". Successively, the microwave power source (not shown in the figure) is switched on to apply a microwave with a desired power into each of the plasma treating chambers 911, 911' and 911" through each of the rectangular waveguides 601, 601' and 601". By this, plasma is generated in a uniform state in each of the plasma treating chambers 911, 911' and 911", wherein the different reaction gas introduced through each of the gas feed means 923, 923' and 923" into each of the plasma treating chambers 911, 911' and 911" is excited and decomposed to produce precursors, which are followed by arriving at the surface of the each of the substrate webs 921, resulting in forming a deposited film with a different chemical composition on the surface of each of them in each of the plasma treating chambers. In this case, in order to efficiently utilize the plasma in the zone opposite the plasma introducing portion 403 in each of the plasma treating chambers, it is possible to transport the two substrate webs 921 while superposing them through their non-deposition faces.

When the plasma treating apparatus of the present invention is operated, the inner pressure of the reaction chamber or the plasma generation chamber and the inner pressure of the treating chamber are respectively determined in the range of 0.01 Torr and 0.5 Torr.

The temperature of a substrate upon forming a deposited film on said substrate in the plasma treating apparatus of the present invention is somewhat different depending upon the kind of a film-forming raw material gas used, the kind of a deposited film formed and the application use of a deposited film formed. However, in general, it is desired to be preferably in the range of 50 to 600° C. or more preferably, in the range of 100 to 400° C.

According to the plasma treating apparatus of the present invention, there can be effectively formed various kinds of deposited films by selectively using an appropriate raw material gas. Specific examples of such deposited film are insulating films such as $Si_3N_4$ film, $SiO_2$ film, $Ta_2O_5$ film, $TiO_2$ film, TiN film, $Al_2O_3$ film, AlN film, $MgF_2$ film, and the like; semiconductor films such as a-Si films, poly-Si films, SiC film, GaAs film, and the like; and metallic films of Al, W, Mo, Ti, Ta, or the like.

The plasma treating apparatus of the present invention can be used for modifying the surface of an object. Specifically, a substrate or a surface layer comprising Si, Al, Ti, Zn or Ta can be oxidized or nitrided using a given raw material gas. Other than this, it is possible to conduct a doping treatment for said substrate or surface layer by using a raw material gas capable imparting a dopant such as B, As, P, or the like.

The plasma treating technique employed in the present invention makes it possible to conduct cleaning for an object. Specifically, the plasma treating technique employed in the present invention can be used for cleaning oxides, organic materials, or heavy metals.

The substrate to be used in the formation of a functional deposited film by the plasma treating apparatus of the present invention may be electroconductive or electrically insulative. Upon forming a functional deposited film a substrate by the plasma treating apparatus of the present invention, it is possible to apply a direct current bias of −500 V to +200 V or an alternate current bias with a frequency of 40 Hz to 300 MHz to the substrate in order to make the resulting deposited film to be dense in terms of texture, or in order to improve the adhesion between the substrate and the resulting deposited film, or in order to provide an improved step coverage for the resulting deposited film.

The electroconductive substrate can include, for example, metals such as Fe, Ni, Cr, Al, Mo, Au, Nb, Ta, V, Ti, Pt, and Pb, and alloys of these metals such as brass, stainless steel, and the like.

The electrically insulative substrate can include, for example, glasses such as $SiO_2$ series quartz glasses; inorganic materials such as $Si_3N_4$, NaCl, KCl, LiF, $CaF_2$, $BaF_2$, $Al_2O_3$, AlN, and MgO; films or sheets of synthetic resins such as polyethylene, polyester, polycarbonate, cellulose acetate, polypropylene, polyvinyl chloride, polyvinylidene chloride, polystyrene, polyamide, and polyimide.

As for the film-forming raw material gas used in the case of forming a deposited film by the plasma treating apparatus of the present invention, there can be used any of the known film-forming raw material gases.

In the case of forming a deposited film using the plasma treating apparatus described in Embodiment 2-(3) or Embodiment 2-(4), it is desired that a raw material gas capable of being easily decomposed with the action of the active species from the plasma generated to cause the formation of a deposited film is used and the raw material gas is introduced into the treating chamber through the second gas feed means 823, in order to attain a desired stoichiometric chemical composition for the deposited film or in order to prevent film deposition from occurring in the plasma generation chamber. In the case of using such a film-forming raw material that is hardly decomposed with the action of the active species from the plasma generated wherein the formation of a deposited film is not effectively caused, it is desired for such film-forming raw material gas to be introduced into the plasma generation chamber through the first gas feed means 813.

As for the film-forming raw material gas to be introduced through the second gas feed means 823, there can be mentioned Si-containing raw material gases which are used in the case of forming Si-containing semiconductor films such as a-Si, poly-Si and SiC semiconductor films. Specific examples of such Si-containing raw material gas are inorganic silanes such as $SiH_4$, $Si_2H_6$, and the like; organic silanes such as tetraethylsilane (TES), tetramethylsilane (TMS), dimethylsilane (DMS), and the like; and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, $SiCl_2F_2$, and the like, which are in the gaseous state at room temperature and at normal pressure or can be easily gasified. In this case, a plasma generating raw material gas is introduced through the first gas feed means 813. Specific examples of such plasma generating raw material gas are $H_2$ gas, He gas, Ne gas, Ar gas, Kr gas, Xe gas, and Rn gas.

In the case of forming a Si-containing compound series deposited film such as $Si_3N_4$ film, $SiO_2$ film or the like, a Si-containing raw material gas is introduced through the second gas feed means 823. Specific examples of such Si-containing raw material gas are inorganic silanes such as $SiH_4$, $Si_2H_6$, and the like; organic silanes such as tetraethoxysilane (TEOS), tetramethoxysilane (TMOS), octamethylcyclotetrasilane (OMCTS), and the like; and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, $SiCl_2F_2$, and the like, which are in the gaseous state at room temperature and at normal pressure or can be easily gasified. And in this case, through the first gas feed means 813, there is introduced a raw material gas selected from the group consisting of $N_2$, $NH_3$, $N_2H_4$, hexamethyldisilane (HMDS), $O_2$, $O_3$, $H_2O$, NO, $N_2O$, and $NO_2$.

In the case of forming a metallic deposited film of a metal such as Al, W, Mo, Ti, Ta, or the like, a raw material gas containing a given metal atom is introduced through the second gas feed means 823. As such raw material gas, there can be mentioned gaseous materials of organometallic compounds such as trimethylaluminum (TMAl), triethylaluminum (TEAl), triisobutylyaluminum (TIBAl), dimethylaluminumhydride (DMAlH), tungsten carbonyl ($W(CO)_6$), molybdenum carbony ($Mo(CO)_6$), trimethylgallium (TMGa), and triethylgallium (TEGa); and gaseous materials of metal halides such as $AlCl_3$, $WF_6$, $TiCl_3$, and $TaCl_5$. In this case, a plasma generating raw material gas is introduced through the first gas feed means 813. Specific examples of such plasma generating raw material gas are $H_2$ gas, He gas, Ne gas, Ar gas, Kr gas, Xe gas, and Rn gas.

In the case of forming a metallic deposited film of $Al_2O_3$, AlN, $Ta_2O_5$, $TiO_2$, TiN, $WO_3$, or the like, a raw material gas containing a given metal atom is introduced through the second gas feed means 823. As such raw material gas, there can be mentioned gaseous materials of organometallic compounds such as trimethylaluminum (TMAl), triethylaluminum (TEAl), triisobutylyaluminum (TIBAl), dimethylaluminumhydride (DMAlH), tungsten carbonyl ($W(CO)_6$), molybdenum carbony ($Mo(CO)_6$), trimethylgallium (TMGa), and triethylgallium (TEGa); and gaseous materials of metal halides such as $AlCl_3$, $WF_6$, $TiCl_3$, and $TaCl_5$. And in this case, through the first gas feed means 813, there is introduced a raw material gas selected from the group consisting of $O_2$, $O_3$, $H_2O$, NO, $N_2O$, $NO_2$, $N_2$, $NH_3$, $N_2H_4$, and hexamethyldisilane (HMDS).

In the case of oxidizing the surface of an object using the plasma treating apparatus of the present invention, a raw material gas selected from the group consisting of $O_2$, $O_3$, $H_2O$, NO, $N_2O$, $NO_2$ is introduced through the first gas feed means 813. In the case of nitriding the surface of an object using the plasma treating apparatus of the present invention, a raw material gas selected from the group consisting of $N_2$, $NH_3$, $N_2H_4$, and hexamethyldisilane (HMDS) is introduced through the gas feed means 813. In any of these two cases, since no film formation is conducted, no raw material gas is introduced through the second gas feed means 823 in general. However, the same raw material gas as that introduced through the first gas feed means 813 can be introduced through the second gas feed means 823.

In the case of cleaning organic foreign matters deposited on the surface of an object using the plasma treating apparatus of the present invention, a cleaning raw material gas selected from the group consisting of $O_2$, $O_3$, $H_2O$, NO, $N_2O$, $NO_2$ is introduced through the first gas feed means 813. In the case of cleaning inorganic foreign matters deposited on the surface of an object using the plasma treating apparatus of the present invention, a cleaning raw material gas selected from the group consisting of $F_2$, $CF_2$, $CH_2F_2$, $C_2F_2$, $CF_2Cl_2$, $SF_6$, and $NF_3$ is introduced through the first gas feed means 813. In any of these two cases, since no film formation is conducted, no raw material gas is introduced through the second gas feed means 823 in general. However, the same raw material gas as that introduced through the first gas feed means 813 can be introduced through the second gas feed means 823.

In the case of conducting any of the foregoing processes using the plasma treating apparatus described in Embodiment 2-(1), 2-(2), 2-(5) or 2-(6) of the present invention, the corresponding raw material gas is introduced through the sole gas feed means.

In the case of forming a deposited film through which a microwave is hardly transmitted using the plasma treating apparatus described in Embodiment 2-(1), 2-(2), 2-(5) or 2-(6) of the present invention, in order to prevent a film from depositing on the inner wall face of the quartz tube, it is desired to take a procedure of spraying a purging gas to the inner wall face of the quartz tube, a procedure of disposing a cover glass at the inner wall face of the quartz tube and moving or removing said cover glass, or a procedure of conducting self-cleaning with the use of plasma resulted from an etching gas, or other than these procedures, to employ a mechanism of replacing the used quartz tube by a new quartz tube.

USE EXAMPLES

The advantages and effects of microwave introducing device according to the present invention and the plasma treating apparatus provide with the said device will be described in more detail by reference to the following use examples, which are not intended to limit the scope of the present invention.

Use Example 1

Using the plasma treating apparatus shown in FIG. 7(A), there was formed an amorphous silicon film (a-Si:H film) having a function as a photosensitive layer for an electrophotographic photosensitive drum. As the circular waveguide 101 of the plasma treating apparatus, there was used one having the configuration shown in FIG. 4(A). As the substrate 721, there was used a cylindrical drum made of aluminum.

The cylindrical drum 721 was positioned at the center of the plasma treating chamber 111, and the inside of the plasma treating chamber 111 was evacuated to a vacuum degree of $10^{-6}$ Torr by means of the exhaust system (not shown in the figure). The cylindrical drum 721 was then heated to and maintained at 350° C. by means of the heating means (not shown in the figure). Thereafter, monosilane gas and $H_2$ gas were supplied into the plasma generation chamber 111 through the gas feed means 723 at respective flow rates of 600 sccm and 350 sccm. The gas pressure in the plasma generation chamber 111 was maintained at 10 mTorr by regulating the exhaust system. Successively, the microwave power source of 2.45 GHz (not shown in the figure) was switched on to apply a microwave with a power of 1500 W into the plasma generation chamber 111 through the circular waveguide 101. By this, plasma was generated in a uniform state in the plasma generation chamber 111, resulting in forming a 30 μm thich a-Si film on the surface of the cylindrical drum 721.

The resultant film was evaluated with respect to deposition rate, film uniformity and hydrogen content. The measurement of the hydrogen content was conducted by means of a hydrogen content analyzer (trademark name: EMGA-1100, produced by Horiba Seisakusho Kabushiki Kaisha). As a result, the resultant a-Si film was found to be 750 nm/minute for the deposition rate and ±3.7% for the film uniformity, which are satisfactory. The hydrogen content thereof was found to be 12 mol. %.

From these evaluated results, it was found that the resultant film is of a high quality.

Separately, the photosensitive drum obtained in this example was evaluated with respect to its image-forming performance by setting it to a copying machine for experimental purposes comprising a partial modification of a commercially available copying machine NP-7550 produced by Canon Kabushiki Kaisha, wherein image formation was repeatedly conducted using a test chart produced by Canon Kabushiki Kaisha while properly adjusting the image-forming conditions involved. As a result, it was found that the photosensitive drum repeatedly provides a high quality copied image over a long period of time.

Use Example 2

Using the plasma treating apparatus shown in FIG. 7(B), there was formed an amorphous silicon film. As the circular waveguide 101 of the plasma treating apparatus, there was used one having the configuration shown in FIG. 4(A). As the substrate 721, there were used six cylindrical drums each being made of aluminum.

The six cylindrical drums 721 were spacedly arranged in the plasma treating chamber 111, and each of them was rotated on its own axis. The inside of the plasma treating chamber 111 was evacuated to a vacuum degree of $10^{31\ 6}$ Torr by means of the exhaust system (not shown in the figure). Each of the cylindrical drums 721 was then heated to and maintained at 350° C. by means of the heating means (not shown in the figure). Thereafter, monosilane gas and $H_2$ gas were supplied into the plasma generation chamber 111 through the gas feed means 723 at respective flow rates of 900 sccm and 500 sccm. The gas pressure in the plasma generation chamber 111 was maintained at 12 mTorr by regulating the exhaust system. Successively, the microwave power source of 2.45 GHz (not shown in the figure) was switched on to apply a microwave with a power of 1500 W into the plasma generation chamber 111 through the circular waveguide 101. By this, plasma was generated in a uniform state in the plasma generation chamber 111, resulting in forming a 30 μm amorphous silicon film on the surface of each of the six cylindrical drums 721.

Each of the resultant films was evaluated with respect to deposition rate, film uniformity and hydrogen content. The measurement of the hydrogen content was conducted by means of a hydrogen content analyzer (trademark name: EMGA-1100, produced by Horiba Seisakusho Kabushiki Kaisha). As a result, each of the resultant a-Si films was found to be 330 nm/minute for the deposition rate and ±4.3% for the film uniformity, which are satisfactory. The hydrogen content of each of the films was found to be 15 mol. %.

From these evaluated results, it was found that each of the resultant films is of a high quality.

Separately, each of the six photosensitive drums obtained in this example was evaluated with respect to its image-forming performance by setting it to a copying machine for experimental purposes comprising a partial modification of a commercially available copying machine NP-7550 produced by Canon Kabushiki Kaisha, wherein image formation was repeatedly conducted using a test chart produced by Canon Kabushiki Kaisha while properly adjusting the image-forming conditions involved. As a result, it was found that each of the photosensitive drums repeatedly provides a high quality copied image over a long period of time.

Use Example 3

There was formed a silicon oxide film for use as a gate insulator in a semiconductor device, using the remote plasma CVD apparatus shown in FIG. 8(A). As the circular waveguide 801 of the plasma treating apparatus, there was used one having the configuration shown in FIG. 4(A).

As the substrate 821, there was used a p-type single crystal silicon plate (face orientation: (100), resistivity: 10 Ωcm). The silicon plate 821 was positioned on the substrate holder 822. The inside of each of the plasma generation chamber 811 and the film-forming chamber 820 was evacuated to $10^{-6}$ Torr by means of the exhaust system 851. The silicon plate 821 was then heated to and maintained at 300° C. by energizing the heating means 831. Thereafter, $O_2$ gas was introduced into the plasma generation chamber 811 through the first gas feed means 813 at a flow rate of 500 sccm, and at the same time, monosilane gas was introduced into the film-forming chamber 820 through the second gas feed means 823 at a flow rate of 500 sccm. The gas pressure in the plasma generation chamber 811 and that in the film-forming chamber 820 were maintained at respective pressures of 0.15 Torr and 0.05 Torr by regulating the conductance valve (not shown in the figure) disposed at the exhaust system 851. Successively, the microwave power source of 2.45 GHz (not shown in the figure) was switched on to apply a microwave with 500 W into the plasma generation chamber 811 through the circular waveguide 801. By this, plasma was generated in a uniform state in the plasma generation chamber 811. The plasma was generated in a localized state with a high density in the form of a crown-like shape. Herein, the $O_2$ gas introduced through the first gas feed means 813 into the plasma generation chamber 811 was excited and decomposed to produce active species comprising excited oxygen atoms, which were followed by transporting toward the silicon plate 821, wherein the active species were reacted with the monosilane gas introduced through the second gas feed means 823 to cause the formation of a silicon oxide film on the surface of the silicon plate 821. The thickness of the silicon oxide film formed was 0.1 μm.

The resultant film was evaluated with respect to deposition rate, film uniformity, leakage current, withstand voltage, and interfacial level density.

The leakage current was examined in the following manner. That is, an Al electrode was formed on the film obtained, and an electric field of 5 MV/cm was applied to the film by applying a given direct current voltage between the Al electrode and the silicon plate wherein an electric current flown was measured. The withstand voltage was evaluated based on an electric field when a leakage current of more than $1 \times 10^{-6}$ A/cm$^2$. The interfacial level density was evaluated on the basis of a C-V curve obtained by a conventional capacity meter upon applying 1 MHzRF.

As a result, the resultant silicon oxide film was found to be 120 nm/minute for the deposition rate and ±2.6% for the film uniformity, which are satisfactory. Further, the resultant silicon oxide film was found to be $4 \times 10$ A/cm$^2$ for the leakage current, 10 MV/cm for the withstand voltage, and $5 \times 10^{10}$ cm$^{-2}$ for the interfacial level density.

From these evaluated results, it was found that the resultant silicon oxide film is of a high quality.

Use Example 4

There was formed a silicon nitride film for use as a protective layer of a semiconductor device, using the photo-assisted plasma CVD apparatus shown in FIG. 8(B). As the circular waveguide 801 of the plasma treating apparatus, there was used one having the configuration shown in FIG. 4(A).

As the substrate 821, there was used a p-type single crystal silicon plate (face orientation: (100), resistivity: 10 Ωcm). The silicon plate 821 was positioned on the substrate holder 822. The inside of each of the plasma generation chamber 811 and the film-forming chamber 820 was evacuated to $10^{-6}$ Torr by means of the exhaust system 851. A Xe lamp of the lighting system 833 was energized to irradiate light to the surface of the silicon plate at an illuminance of 0.6 W/cm$^2$. The silicon plate 821 was then heated to and maintained at 300° C. by energizing the heating means 831. Thereafter, $N_2$ gas was introduced into the plasma generation chamber 811 through the first gas feed means 813 at a flow rate of 1000 sccm, and at the same time, monosilane gas was introduced into the film-forming chamber 820 through the second gas feed means 823 at a flow rate of 100 sccm. The gas pressure in the plasma generation chamber 811 and that in the film-forming chamber 820 were maintained at respective pressures of 0.18 Torr and 0.03 Torr by regulating the conductance valve (not shown in the figure) disposed at the exhaust system 851. Successively, the microwave power source of 2.45 GHz (not shown in the figure) was switched on to apply a microwave with 500 W into the plasma generation chamber 811 through the circular waveguide 801. By this, plasma was generated in a uniform state in the plasma generation chamber 811. Herein, the $N_2$ gas introduced through the first gas feed means 813 into the plasma generation chamber 811 was excited and decomposed to produce active species, which were followed by transporting toward the silicon plate 821, wherein the active species were reacted with the monosilane gas introduced through the second gas feed means 823 to cause the formation of a silicon nitride film on the surface of the silicon plate 821. The thickness of the silicon nitride film formed was 1.0 μm.

The resultant film was evaluated with respect to deposition rate, leakage current, withstand voltage and stress.

The stress was examined by measuring a change in warpage of the silicon plate between at the stage prior to the film formation and at the stage after the film formation by an interferometer commercially available under the trade name Zygo.

As a result, the resultant silicon nitride film was found to be 280 nm/minute for the deposition rate, which is extremely great. Further, the resultant silicon nitride film was found to be $1 \times 10^{-10}$ A/cm$^2$ for the leakage current, 8 MV/cm for the withstand voltage, and b $1 \times 10^9$ dyn/cm$^2$ for the stress.

From these evaluated results, it was found that the resultant silicon nitride film is of a high quality.

Use Example 5

There was formed a silicon oxide film used for layer insulation in a semiconductor device, using the photo-assisted plasma CVD apparatus shown in FIG. 8(B). As the circular waveguide 801 of the plasma treating apparatus, there was used one having the configuration shown in FIG. 4(A).

As the substrate 821, there was used a p-type single crystal silicon plate (face orientation: (100), resistivity: 10 Ωcm). The silicon plate 821 was positioned on the substrate holder 822. The inside of each of the plasma generation chamber 811 and the film-forming chamber 820 was evacuated to $10^{-6}$ Torr by means of the exhaust system 851. A very high pressure mercury lamp of the lighting system 833 was energized to irradiate light to the surface of the silicon plate at an illuminance of 0.4 W/cm$^2$. The silicon plate 821 was then heated to and maintained at 300° C. by energizing the heating means 831. Thereafter, $O_2$ gas was introduced into the plasma generation chamber 811 through the first gas feed means 813 at a flow rate of 2000 sccm, and at the same time, tetraethoxysilane (TEOS) gas was introduced into the film-forming chamber 820 through the second gas feed means 823 at a flow rate of 500 sccm. The gas pressure in the plasma generation chamber 811 and that in the film-forming chamber 820 were maintained at respective pressures of 0.3 Torr and 0.05 Torr by regulating the conductance valve (not shown in the figure) disposed at the exhaust system 851. Successively, the microwave power source of 2.45 GHz (not shown in the figure) was switched on to apply a microwave with 1000 W into the plasma generation chamber 811 through the circular waveguide 801, wherein plasma was generated in a uniform state in the plasma generation chamber 811. This process was continued to form a 1.0 μm thick silicon oxide film on the silicon plate 821.

The resultant film was evaluated with respect to deposition rate, film uniformity, leakage current, withstand voltage and step coverage.

The step coverage was examined by repeating the above film-forming procedures to form a silicon oxide film on an aluminum member with steps formed in a line pattern with 0.5 um in line and space, observing a cross section of the silicon oxide film using a scanning electron microscope (SEM), and based on the observed results, obtaining a ratio (a cover factor) between the film thickness on the step and the film thickness on the side wall of the step.

As a result, the resultant silicon oxide film was found to be 220 nm/minute for the deposition rate and ±2.7% for the film uniformity, which are respectively satisfactory. Further, the resultant silicon oxide film was found to be $1 \times 10^{-10}$ $A/cm^2$ for the leakage current, 9 MV/cm for the withstand voltage, and 0.9 for the cover factor.

From these evaluated results, it was found that the resultant silicon oxide film exhibits good characteristics and is suitable for layer insulation in a semiconductor device.

Use Example 6

There was formed a silicon oxide film used for layer insulation in a semiconductor device by oxidizing the surface of a silicon plate, using the photo-assisted plasma CVD apparatus shown in FIG. 8(A) as a surface modifying apparatus. As the circular waveguide 801 of the apparatus, there was used one having the configuration shown in FIG. 4(A).

As the substrate 821, there was used a p-type single crystal silicon plate (face orientation: (100), resistivity: 10 Ωcm). The silicon plate 821 was positioned on the substrate holder 822. The inside of each of the plasma generation chamber 811 and the treating chamber 820 was evacuated to $10^{-6}$ Torr by means of the exhaust system 851. The silicon plate 821 was then heated to and maintained at 500° C. by energizing the heating means 831. Thereafter, $O_2$ gas was introduced into the plasma generation chamber 811 through the first gas feed means 813 at a flow rate of 500 sccm. The gas pressure in the plasma generation chamber 811 and that in the treating chamber 820 were maintained at respective pressures of 0.15 Torr and 0.03 Torr by regulating the conductance valve (not shown in the figure) disposed at the exhaust system 851. Successively, the microwave power source of 2.45 GHz (not shown in the figure) was switched on to apply a microwave with 1000 W into the plasma generation chamber 811 through the circular waveguide 801. By this, plasma was generated in a uniform state in the plasma generation chamber 811. The plasma was generated in a localized state with a high density in the form of a crown-like shape. Herein, the $O_2$ gas introduced through the first gas feed means 813 into the plasma generation chamber 811 was excited and decomposed to produce active species comprising excited oxygen atoms, which were followed by transporting toward the silicon plate 821, wherein the active species were reacted with the surface of the silicon plate 821 to cause the formation of a 50 nm thick silicon oxide film on the silicon plate 821.

The resultant film was evaluated with respect to film forming speed, film uniformity, leakage current, and withstand voltage.

As a result, the resultant silicon oxide film was found to be 1.2 nm/minute for the film forming speed and ±2.2% for the film uniformity, which are satisfactory. Further, the resultant silicon oxide film was found to be $2 \times 10^{-11}$ $A/cm^2$ for the leakage current and 12 MV/cm for the withstand voltage.

From these evaluated results, it was found that the resultant silicon oxide film excels in characteristics and it is suitable for layer insulation in a semiconductor device.

Use Example 7

There was formed a $SiO_2$ film capable of serving an abrasion resistant layer for a plastic film, using the plasma treating apparatus shown in FIG. 9(A) as a gate type plasma CVD apparatus. As the circular waveguide 601, there was used one shown in FIG. 6(A).

As the substrate web 921, there was used a web-like plastic film.

The substrate web 921 was paid out from each of the pay-out bobbins (not shown in the figure), it was passed through the plasma treating chamber 911, and it was fixed to each of the take-up bobbins 922. The pay-out bobbins and the take-up bobbins 922 were rotated to move the substrate webs 921 at a transportation speed of 10 mm/minute. The inside of the plasma treating chamber 911 was evacuated to $10^{-6}$ Torr by means of the exhaust system (not shown in the figure). Monosilane gas and oxygen gas were supplied into the plasma treating chamber 911 at respective flow rates of 200 sccm and 1000 sccm through the gas feed means (not shown in the figure). The gas pressure in the plasma treating chamber 911 was maintained at 30 mTorr by regulating the exhaust system (not shown in the figure). Successively, the microwave power source of 2.45 GHz (not shown in the figure) was switched on to apply a microwave with 1000 W into the plasma treating chamber 811 through the circular waveguide 601. By this, plasma was generated in a uniform state in the plasma treating chamber 911. This state was maintained for a given period of time to form a 10 um thick $SiO_2$ film on the surface of each of the substrate webs 921.

The resultant film was evaluated with respect to deposition rate, film uniformity, and abrasion resistance. The abrasion resistance was evaluated based on a worn thickness obtained as a result of rubbing the specimen by a abrasion resistance test paper 1000 times.

As a result, the resultant $SiO_2$ film was found to be 600 nm/minute for the deposition rate and ±5.6% for the film uniformity, which are satisfactory. The abrasion resistance of the resultant $SiO_2$ film was found to be 5 nm/100 shots, which is extremely small.

From these evaluated results, it was found that the $SiO_2$ film excels in abrasion resistance and it is of a high quality.

Use Example 8

There was formed a pin junction photovoltaic layer for solar cell, using the plasma treating apparatus shown in FIG. 9(B) as a multiple gate type plasma CVD apparatus.

As each of the circular waveguides 601, 601' and 601", there was used one shown in FIG. 6(A).

As the substrate web 921, there was used a SUS 430 BA web member of 60 cm in width and 0.2 mm in thickness applied with an Al film as a lower electrode to the surface thereof. The substrate web 921 was paid out from each of the pay-out bobbins 951, it was passed through the first plasma treating chamber 911, the second plasma treating chamber 911' and the third plasma treating chamber 911", and it was fixed to each of the take-up bobbins 952. The pay-out bobbins 951 and the take-up bobbins 952 were rotated to move the substrate webs 921 at a transportation speed of 0.8 m/minute. The substrate webs 921 were heated to and maintained at 350° C. by means of the heating means 953, 953' and 953". The inside of each of the plasma treating chambers 911, 911' and 911" was evacuated to 10 Torr by operating each of the exhaust means 960, 960' and 960".

Then, in the first plasma treating chamber 911, monosilane gas, hydrogen gas, $PH_3/H_2$ (=1%) gas, and silicon tetrafluoride gas were introduced thereinto at respective flow rates of 60 sccm, 100 sccm, 10 sccm and 5 sccm through the gas feed means 923. The gas pressure in the plasma treating chamber 911 was adjusted to and maintained at 15 mTorr by regulating the exhaust system 960. Then, the microwave power source of 2.45 GHz (not shown in the figure) was switched on to apply a microwave power with 800 W into the plasma treating chamber 911 through the circular waveguide 601 to generate plasma, whereby forming an n-type a-Si:H:F film on the substrate web 921.

In the second plasma treating chamber 911', monosilane gas, hydrogen gas, and silicon tetrafluoride gas were introduced thereinto at respective flow rates of 300 sccm, 100 sccm, and 10 sccm through the gas feed means 923'. The gas pressure in the plasma treating chamber 911' was adjusted to and maintained at 10 mTorr by regulating the exhaust system 960'. Then, the microwave power source of 2.45 GHz (not shown in the figure) was switched on to apply a microwave power with 1200 W into the plasma treating chamber 911' through the circular waveguide 601' to generate plasma, whereby forming an i-type a-Si:H:F film on the n-type a-Si:H:F film formed in the first plasma treating apparatus 911.

In the third plasma treating chamber 911", monosilane gas, hydrogen gas, $B_2H_6/H_2$ (=0.3%) gas, and silicon tetrafluoride gas were introduced thereinto at respective flow rates of 20 sccm, 200 sccm, 10 sccm and 5 sccm through the gas feed means 923". The gas pressure in the plasma treating chamber 911" was adjusted to and maintained at 20 mTorr by regulating the exhaust system 960". Then, the microwave power source of 2.45 GHz (not shown in the figure) was switched on to apply a microwave power with 1200 W into the plasma treating chamber 911" through the circular waveguide 601" to generate plasma, whereby forming a p-type a-Si:H:F film on the i-type a-Si:H:F film formed in the second plasma treating chamber 911'.

Using the nip stacked film thus obtained, there were prepared a plurality of solar cell modules each being 40 cm× 80 cm in size. As for these solar cell modules, their photoelectric conversion efficiency was evaluated. The evaluation of the photoelectric conversion efficiency was conducted by subjecting each of the solar cell modules to irradiation with light having an intensity of 0.1 W/cm². As a result, it was found that each of the solar cell modules exhibits a photoelectric conversion efficiency of 8.8% and is stable in terms of solar cell characterics.

I claim:

1. A plasma treating apparatus comprising a substantially enclosed plasma generation chamber and a microwave introducing device disposed beside an exterior of said plasma generation chamber, wherein plasma is generated by applying a microwave into said plasma generation chamber through said microwave introducing device to generate plasma whereby treating an object positioned in said plasma generation chamber, wherein said microwave introducing device comprises an endless circular waveguide provided with a plurality of slots, said circular waveguide being provided with a microwave introducing portion connected to a microwave power source, and said plurality of slots being spacedly formed through an inner side of said circular waveguide such that the slots are arranged at said inner side of said circular waveguide at a given interval.

2. A plasma treating apparatus according to claim 1, wherein the plurality of slots are spaced at an interval corresponding to a ¼ of the guide wavelength of a microwave introduced into the circular waveguide.

3. A plasma treating apparatus according to any of claims 1 or 2, wherein said microwave introducing portion is directed toward the tangential direction of said circular waveguide.

4. A plasma treating apparatus according to any of claims 1 or 2, wherein the plurality of slots are designed such that their length distribution is increased along the direction of a microwave to transmit.

5. A plasma treating apparatus according to any of claims 1 or 3, wherein said microwave introducing portion is disposed in a direction perpendicular to said circular waveguide, and said microwave introducing portion includes means capable of dividing a microwave introduced in two ways and facilitating the microwaves divided to transmit in opposite sides in said circular waveguide.

6. A plasma treating apparatus according to any of claims 1 or 5 which is provided with a plurality of magnetic field generating means each being capable of generating a magnetic field in the vicinity of each pair of adjacent slots and in parallel to said inner side face of said circular waveguide.

7. A plasma treating apparatus comprising a substantially enclosed plasma generation chamber and a microwave introducing device disposed beside an exterior of said plasma generation chamber, wherein plasma is generated by applying a microwave into said plasma generation chamber through said microwave introducing device to generate plasma whereby treating an object positioned in a filmforming chamber in communication with said plasma generation chamber wherein the object is situated so as to isolate the region where said plasma is generated, wherein said microwave introducing device comprises an endless circular waveguide provided with a plurality of slots, said circular waveguide being provided with a microwave introducing portion connected to a microwave power source, and said plurality of slots being spacedly formed through an inner side of said circular waveguide such that the slots are arranged at said inner side of said circular waveguide at a given interval.

8. A plasma treating apparatus according to claim 7, wherein the plurality of slots are spaced at an interval corresponding to a ¼ of the guide wavelength of a microwave introduced into said circular waveguide.

9. A plasma treating apparatus according to any of claims 7 or 8, wherein said microwave introducing portion is directed toward the tangential direction of said circular waveguide.

10. A plasma treating apparatus according to any of claims 7 or 9, wherein the plurality of slots are designed such that their length distribution is increased along the direction of a microwave to transmit.

11. A plasma treating apparatus according to any of claims 7 or 8, wherein said microwave introducing portion is disposed in a direction perpendicular to said circular waveguide, and said microwave introducing portion includes means capable of dividing a microwave introduced in two ways and facilitating the microwaves divided to transmit in opposite sides in said circular waveguide.

12. A plasma treating apparatus according to any of claims 7 or 8 which is provided with a plurality of magnetic field generating means each being capable of generating a magnetic field in the vicinity of each pair of adjacent slots and in parallel to said inner side face of said circular waveguide.

13. A plasma treating apparatus comprising a substantially enclosed plasma generation chamber and a microwave introducing device disposed beside an exterior of said plasma generation chamber, wherein plasma is generated by applying a microwave into said plasma generation chamber through said microwave introducing device to generate plasma whereby treating a cylindrical substrate as an object to be treated is arranged at a fixed position or continuously moving in an axial direction, wherein said microwave introducing device comprises an endless circular waveguide provided with a plurality of slots, said circular waveguide being provided with a microwave introducing portion connected to a microwave power source, and said plurality of slots being spacedly formed through an inner side of said circular waveguide such that the slots are arranged at said inner side of said circular waveguide at a given interval.

14. A plasma treating apparatus according to claim 13, wherein the plurality of slots are spaced at an interval corresponding to a ¼ of the guide wavelength of a microwave introduced into said circular waveguide.

15. A plasma treating apparatus according to any of claims 13 or 14, wherein said microwave introducing portion is directed toward the tangential direction of said circular waveguide.

16. A plasma treating apparatus according to any of claims 13 or 14, wherein the plurality of slots are designed such that their length distribution is increased along the direction of a microwave to transmit.

17. A plasma treating apparatus according to any of claims 13 or 14, wherein said microwave introducing portion is disposed in a direction perpendicular to said circular waveguide, and said microwave introducing portion includes means capable of dividing a microwave introduced in two ways and facilitating the microwaves divided to transmit in opposite sides in said circular waveguide.

18. A plasma treating apparatus according to any of claims 13 or 14 which is provided with a plurality of magnetic field generating means each being capable of generating a magnetic field in the vicinity of each pair of adjacent slots and in parallel to said inner side face of said circular waveguide.

19. A plasma treating apparatus according to claim 13, wherein the object to be treated comprises a plurality of cylindrical substrates arranged in parallel with each other.

20. A plasma treating apparatus comprising a substantially enclosed plasma generation chamber having a cross section in a rectangular form and a rectangular microwave introducing device disposed beside an exterior of said plasma generation chamber, wherein plasma is generated by applying a microwave into said plasma generation chamber through said microwave introducing device to generate plasma whereby treating a web member or a lengthy substrate as an object to be treated while continuously moving the web member or said lengthy substrate in the longtudinal direction, wherein said microwave introducing device comprises an endless circular waveguide provided with a plurality of slots, said circular waveguide being provided with a microwave introducing portion connected to a microwave power source, and the plurality of slots being spacedly formed through an inner side of said circular waveguide such that the slots are arranged at said inner side of said circular waveguide at a given interval.

21. A plasma treating apparatus according to claim 20, wherein the plurality of slots are spaced at an interval corresponding to a ¼ of the guide wavelength of a microwave introduced into the circular waveguide.

22. A plasma treating apparatus according to any of claims 20 or 21, wherein the microwave introducing portion is directed toward the tangential direction of said circular waveguide.

23. A plasma treating apparatus according to any of claims 20 or 21, wherein the plurality of slots are designed such that their length distribution is increased along the direction of a microwave to transmit.

24. A plasma treating apparatus according to claim 21, wherein said microwave introducing portion is disposed in the direction perpendicular to said circular waveguide, and said microwave introducing portion includes means capable of dividing a microwave introduced in two ways and facilitating the microwaves divided to transmit in opposite sides in said circular waveguide.

25. A plasma treating apparatus according to claim 21 which is provided with a plurality of magnetic field generating means each being capable of generating a magnetic field in the vicinity of each pair of adjacent slots and in parallel to said inner side face of said circular waveguide.

26. A plasma treating apparatus comprising a substantially enclosed plasma generation chamber having a cross section in a rectangular form and a rectangular microwave introducing device disposed beside an exterior of said plasma generation chamber, wherein plasma is generated by applying a microwave into said plasma generation chamber through said microwave introducing device to generate plasma whereby treating two web members or lengthy substrates as an object to be treated while facing two deposition faces of said two web members or lengthy substrates toward said microwave introducing device and while not moving or continuously moving said two web members or lengthy substrates in the longtudinal direction, wherein said microwave introducing device comprises an endless circular waveguide provided with a plurality of slots, said circular waveguide being provided with a microwave introducing portion connected to a microwave power source, and the plurality of slots being spacedly formed through an inner side of said circular waveguide such that the slots are arranged at said inner side of said circular waveguide at a given interval.

27. A plasma treating apparatus according to claim 26, wherein the plurality of slots are spaced at an interval corresponding to a ¼ of the guide wavelength of a microwave introduced into said circular waveguide.

28. A plasma treating apparatus according to any of claims 26 or 27, wherein said microwave introducing portion is directed toward the tangential direction of said circular waveguide.

29. A plasma treating apparatus according to any of claims 26 or 27, wherein the plurality of slots are designed such that their length distribution is increased along the direction of a microwave to transmit.

30. A plasma treating apparatus according to any of claims 26 or 27, wherein the microwave introducing portion is disposed in the direction perpendicular to said circular waveguide, and said microwave introducing portion includes means capable of dividing a microwave introduced in two ways and facilitating the microwaves divided to transmit in opposite sides in said circular waveguide.

31. A plasma treating apparatus according to any of claims 26 or 27 which is provided with a plurality of magnetic field generating means each being capable of generating a magnetic field in the vicinity of each pair of adjacent slots and in parallel to said inner side face of said circular waveguide.

* * * * *

UNITED STATES PATENT AND TRADEMARK OFFICE
CERTIFICATE OF CORRECTION

PATENT NO. : 5,487,875
DATED : January 30, 1996
INVENTOR(S) : Suzuki

It is certified that error appears in the above-indentified patent and that said Letters Patent is hereby corrected as shown below:

Title page item, [56] REFERENCES CITED:

U.S. PATENT DOCUMENTS, "5,587,009   6/1971   Kibler" should read --3,587,009   6/1971   Kibler--.

COLUMN 4:

Line 55, "which enables to" should read --capable of--.

COLUMN 15:

Line 7, "i" should read --1--.

COLUMN 18:

Line 30, "b 42mm" should read --42 mm--.

COLUMN 23:

Line 40, "materia" should read --material--.

COLUMN 35:

Line 65, "TICl$_3$," should read --TiCl$_3$,--.

COLUMN 36:

Line 12, "TICl$_3$," should read --TiCl$_3$,--.

COLUMN 39:

Line 36, "4x10 A/cm$^2$" should read --4x10$^{-11}$ A/cm$^2$--.

UNITED STATES PATENT AND TRADEMARK OFFICE
CERTIFICATE OF CORRECTION

PATENT NO. : 5,487,875
DATED : January 30, 1996
INVENTOR(S) : Suzuki

Page 2 of 3

It is certified that error appears in the above-indentified patent and that said Letters Patent is hereby corrected as shown below:

COLUMN 40:

Line 29, "b 1x10$^9$ dyn/cm$^2$" should read --1x10$^9$ dyn/cm$^2$--.

COLUMN 43:

Line 4, "10 Torr" should read --10$^{-6}$ Torr--.

COLUMN 44:

Line 16, "3," should read --2,--.
Line 23, "5" should read --2--.
Line 35, "chamber" should read --chamber,--.
Line 54, "9," should read --8,--.

UNITED STATES PATENT AND TRADEMARK OFFICE
CERTIFICATE OF CORRECTION

PATENT NO. : 5,487,875
DATED : January 30, 1996
INVENTOR(S) : Suzuki

It is certified that error appears in the above-indentified patent and that said Letters Patent is hereby corrected as shown below:

COLUMN 45:

Line 54, "said" should read --the--.

COLUMN 46:

Line 32, "longtudinal" should read --longitudinal--.

Signed and Sealed this

Twenty-seventh Day of August, 1996

Attest:

BRUCE LEHMAN

Attesting Officer    Commissioner of Patents and Trademarks